(12) United States Patent
Andoh et al.

(10) Patent No.: US 8,363,863 B2
(45) Date of Patent: Jan. 29, 2013

(54) PIEZOELECTRIC SPEAKER, SPEAKER APPARATUS, AND TACTILE FEEDBACK APPARATUS

(75) Inventors: Masamichi Andoh, Nagaokakyo (JP); Satoshi Kuretake, Nagaokakyo (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 257 days.

(21) Appl. No.: 12/954,734

(22) Filed: Nov. 26, 2010

(65) Prior Publication Data

US 2011/0128245 A1 Jun. 2, 2011

Related U.S. Application Data

(63) Continuation of application No. PCT/JP2009/050236, filed on Jan. 9, 2009.

(30) Foreign Application Priority Data

May 29, 2008 (JP) ................... 2008-140977

(51) Int. Cl.
*H04R 17/00* (2006.01)
*G06F 3/041* (2006.01)
(52) U.S. Cl. ........................ 381/190; 381/152
(58) Field of Classification Search .................. 381/190, 381/152, 173, 398
See application file for complete search history.

(56) References Cited

U.S. PATENT DOCUMENTS

| | | | |
|---|---|---|---|
| 3,816,774 A | 6/1974 | Ohnuki et al. | |
| 4,056,742 A | 11/1977 | Tibbetts | |
| 5,268,571 A | 12/1993 | Yamamoto et al. | |
| 5,733,683 A | 3/1998 | Searson et al. | |
| 6,120,940 A | 9/2000 | Poehler et al. | |
| 6,323,988 B1 | 11/2001 | Heuer et al. | |
| 6,327,070 B1 | 12/2001 | Heuer et al. | |
| 6,427,017 B1 | 7/2002 | Toki | |
| 7,285,314 B2 | 10/2007 | Mukunoki et al. | |
| 7,459,832 B2 | 12/2008 | Nitto et al. | |
| 7,639,826 B1 | 12/2009 | Azima et al. | |
| 2002/0176592 A1* | 11/2002 | Howarth et al. | 381/190 |
| 2003/0059069 A1 | 3/2003 | Bank et al. | |
| 2004/0090426 A1 | 5/2004 | Bourdelais et al. | |
| 2007/0187794 A1 | 8/2007 | Fukuyoshi et al. | |

(Continued)

FOREIGN PATENT DOCUMENTS

| | | |
|---|---|---|
| GB | 1 260 387 A | 1/1972 |
| JP | 50-117772 U | 3/1949 |

(Continued)

OTHER PUBLICATIONS

PCT/JP2009/052137 International Search Report dated Feb. 27, 2009.

(Continued)

*Primary Examiner* — Yuwen Pan
*Assistant Examiner* — Phan Le
(74) *Attorney, Agent, or Firm* — Dickstein Shapiro LLP

(57) ABSTRACT

A piezoelectric speaker that includes an electrode formed on opposing main surfaces of a piezoelectric sheet having a predetermined stretching axis and made of a chiral polymer. The electrode is divided into four electrode portions by a plurality of dividing lines extending in a radiation direction. The four electrode portions are distributed along the outer peripheral portion except for the central portion of a vibration region. Voltage is applied to the respective four electrode portions in such a manner that electric field vectors generated in the thickness direction of the piezoelectric sheet direct in opposite directions between the adjacent ones of four sheet portions of the piezoelectric sheet to which voltage is applied by the electrode portions.

25 Claims, 30 Drawing Sheets

U.S. PATENT DOCUMENTS

| | | | |
|---|---|---|---|
| 2008/0019544 A1* | 1/2008 | Ogura et al. | 381/190 |
| 2010/0102309 A1 | 4/2010 | Nakahara et al. | |
| 2010/0230629 A1* | 9/2010 | Yu et al. | 252/62.9 R |

FOREIGN PATENT DOCUMENTS

| | | | |
|---|---|---|---|
| JP | 50-083798 A | 7/1975 | |
| JP | 63-104386 A | 5/1988 | |
| JP | 05-022068 A | 1/1993 | |
| JP | 05-022069 A | 1/1993 | |
| JP | 05-052508 A | 3/1993 | |
| JP | 05-067939 A | 3/1993 | |
| JP | 05-122793 A | 5/1993 | |
| JP | 05-152638 A | 6/1993 | |
| JP | 05-347439 A | 12/1993 | |
| JP | 06-061776 A | 3/1994 | |
| JP | 06-349338 A | 12/1994 | |
| JP | 09-327094 A | 12/1997 | |
| JP | 2000-002899 A | 1/2000 | |
| JP | 2000-010125 A | 1/2000 | |
| JP | 2000-152385 A | 5/2000 | |
| JP | 2001-504976 T | 4/2001 | |
| JP | 2001-135149 A | 5/2001 | |
| JP | 2003-125491 A | 4/2003 | |
| JP | 2003-244791 A | 8/2003 | |
| JP | 2003-244792 A | 8/2003 | |
| JP | 2004-127562 A | 4/2004 | |
| JP | 2004-158450 A | 6/2004 | |
| JP | 2004-245996 A | 9/2004 | |
| JP | 2005-006344 A | 1/2005 | |
| JP | 2005-213376 A | 8/2005 | |
| JP | 2005-277340 A | 10/2005 | |
| JP | 2005-303938 A | 10/2005 | |
| JP | 2005-311415 A | 11/2005 | |
| JP | 2006-088538 A | 4/2006 | |
| JP | 2006-155907 A | 6/2006 | |
| JP | 2006-179578 A | 7/2006 | |
| JP | 2006-239883 A | 9/2006 | |
| JP | 2007-036545 A | 2/2007 | |
| JP | 2007-518331 T | 7/2007 | |
| JP | 2007-199513 A | 8/2007 | |
| JP | 2007-300426 A | 11/2007 | |
| JP | 2008-211203 A | 9/2008 | |
| WO | WO-2005/067344 A1 | 7/2005 | |

OTHER PUBLICATIONS

PCT/JP2009/052137 Written Opinion dated Feb. 27, 2009.
Supplementary European Search Report issued for application No. EP 09 75 4472, date of completiion of the search Jul. 18, 2012.
PCT/JP2009/050236 International Search Report dated Apr. 17, 2009.
PCT/JP2009/050236 Written Opinion dated Apr. 17, 2009.

* cited by examiner

PIEZOELECTRIC SPEAKER, SPEAKER APPARATUS, AND TACTILE FEEDBACK APPARATUS

CROSS REFERENCE TO RELATED APPLICATIONS

The present application is a continuation of International Application No. PCT/JP2009/050236, filed Jan. 9, 2009, which claims priority to Japanese Patent Application No. JP2008-140977, filed May 29, 2008, the entire contents of each of these applications being incorporated herein by reference in their entirety.

TECHNICAL FIELD

The present invention relates to a piezoelectric speaker, a speaker apparatus, and a tactile feedback apparatus, and more particularly to a piezoelectric speaker configured to include a piezoelectric sheet made of a polymer, which exhibits piezoelectricity when it is stretched, such as polylactic acid, and a speaker apparatus and a tactile feedback apparatus configured by using the same.

BACKGROUND ART

For example, Japanese Unexamined Patent Publication No. 2003-244792 (Patent Document 1) discloses a transparent piezoelectric film speaker is mounted on a display screen of a cellular phone as being bent in order to output sound from a wide range to enhance a hearing performance from the speaker.

However, mounting the transparent speaker on the display screen as being bent not only deteriorates the visual quality of the device such as a cellular phone, but also sometimes deteriorates visibility of the display screen, since things around it are reflected on the transparent speaker.

Moreover, in the transparent speaker disclosed in Patent Document 1, the side face of the vibration plate is greatly open, so that dusts or other smudges are easy to enter, and once they enter, removing them is a troublesome operation. Further, a protection plate for protecting the display screen and the transparent speaker cannot be shared. If they are shared, waterproof property of the display device is remarkably reduced, since the side face of the transparent speaker is greatly open.

Patent Document 1 discloses PVDF (polyvinylidene fluoride) as an example of a material of a piezoelectric film (piezoelectric sheet) provided to the piezoelectric speaker. FIG. 55 graphically illustrates a result of a displacement calculated by a finite element method, the displacement being generated when electrodes are formed on both surfaces of a PVDF sheet to which a poling is performed in the thickness direction, and two sheets are bonded to form a bimorph 100. In the speaker disclosed in Patent Document 1, the original state before the deformation is bent, but in FIG. 55, the original state before the deformation is defined as a plane, and how it is deformed when voltage is applied thereto is illustrated. It is to be noted that the displacement is illustrated more exaggeratingly than the actual one. When a reverse voltage is applied, it is deformed such that the central portion is sagged downward, contrary to the deformation illustrated in FIG. 55. When an alternating-current voltage is applied, the deformations described above are repeated, which produces vibration to make a sound.

FIG. 55 illustrates the displacement when opposing two sides of the bimorph 100 are fixed. In other words, the bimorph 100 vibrates as illustrated in FIG. 55 when the opposing two sides are fixed, but it hardly vibrates when four sides are fixed, for example.

Therefore, when the bimorph 100 is adopted to a speaker, it is required that the bimorph 100 can be vibrated, and therefore, restriction is imposed on the design for fixing the bimorph 100. When the application of the bimorph 100 to the speaker is considered, it is demanded that the bimorph 100 can be vibrated even if it is fixed on four sides, i.e., on the whole circumference.

Patent Document 1: Japanese Unexamined Patent Publication No. 2003-244792

SUMMARY OF THE INVENTION

In view of the above, an object of the present invention is to provide a piezoelectric speaker that can satisfy the above-mentioned requirements, and a speaker apparatus and a tactile feedback apparatus configured by using the same.

A piezoelectric speaker according to the present invention includes a laminated body configured by bonding a plurality of sheets, each being made of a polymer, to each other, wherein at least one of the plurality of sheets is a piezoelectric sheet that has a predetermined stretching axis and is made of a chiral polymer, wherein first and second electrodes for applying voltage to the piezoelectric sheet are formed on opposing first and second main surfaces in a vibration region, which should be vibrated, on the piezoelectric sheet.

In order to solve the above-mentioned technical problem, in the piezoelectric speaker according to the present invention, at least one of the first and second electrodes is a divided electrode including a plurality of divided electrode portions divided by a plurality of dividing lines extending in a radiation direction, wherein the plurality of electrode portions are distributed along the outer peripheral portion of the vibration region except for the central portion, the plurality of dividing lines have any one of angles within the range of 0 degrees or more and less than 40 degrees and the range of more than 50 degrees to 90 degrees or less with respect to the stretching axis, and voltage is applied by each of the plurality of electrode portions in such a manner that electric field vectors generated in the thickness direction of the piezoelectric sheet direct in opposite directions between the adjacent ones of a plurality of sheet portions of the piezoelectric sheet to which voltage is applied by the plurality of electrode portions.

It is preferable that the plurality of electrode portions described above include first to fourth electrode portions.

In the preferable embodiment described above, it is preferable that the divided electrode is distributed on the central portion of the vibration region as being separated from the first to fourth electrode portions, and further includes fifth to eighth electrode portions divided by the plurality of dividing lines, wherein voltage is applied by each of the first to eighth electrode portions in such a manner that electric field vectors generated in the thickness direction of the piezoelectric sheet direct in opposite directions between the adjacent ones of first to eighth sheet portions of the piezoelectric sheet to which voltage is applied by the first to eighth electrode portions.

In the preferable embodiment described above, it is preferable that, when the first electrode portion and the fifth electrode portion are arranged side by side in the radiation direction, the second electrode portion and the sixth electrode portion are arranged side by side in the radiation direction, the third electrode portion and the seventh electrode portion are arranged side by side in the radiation direction, and the fourth electrode portion and the eighth electrode portion are arranged side by side in the radiation direction, a first connection line that connects the first electrode portion and one of the sixth and eighth electrode portions, a second connection line that connects the second electrode portion and one of the fifth and seventh electrode portions, a third connection line that connects the third electrode portion and the other one of the sixth and eighth electrode portions, and a fourth connection line that connects the fourth electrode portion and the other one of the fifth and seventh electrode portions are formed on the piezoelectric sheet.

In the piezoelectric speaker according to the present invention, the plurality of electrode portions may be configured by two electrode portions located respectively on the first and third portions when the outer peripheral portion is divided into four in such a manner that the first to fourth electrode portions are arranged in this order in the circumferential direction on the outer peripheral portion except for the central portion of the vibration region on the piezoelectric sheet. In this case, voltage is applied, by the respective two electrode portions, to two sheet portions of the piezoelectric sheet to which voltage is respectively applied by the two electrode portions in such a manner that the electric field vectors generated in the thickness direction of the piezoelectric sheet direct in the same direction.

In the piezoelectric speaker according to the present invention, there are a first embodiment in which each of the first and second electrodes is the divided electrode, and a second embodiment in which only one of the first and second electrodes is the divided electrode, and the other one is a uniform common electrode commonly opposing to the plurality of electrode portions forming the divided electrode. The "divided electrode" indicates the whole made of the plurality of divided electrode portions as described above. On the other hand, the uniform electrode commonly opposing to the plurality of electrode portions forming the divided electrode is referred to as the "common electrode".

In the first embodiment, it is preferable that an electrode non-formation region located between the respective electrode portions of the first electrode and an electrode non-formation region located between the respective electrode portions of the second electrode are not substantially overlapped with each other, when the piezoelectric sheet is seen through in the thickness direction thereof.

Further, in the first embodiment, the first and second electrodes are preferably formed with a substantially same pattern.

In the second embodiment, the piezoelectric sheet may include first and second piezoelectric sheets bonded to each other with the respective first main surfaces facing each other, wherein the first electrode may be made of a conductive adhesive agent and may be configured to bond the respective first main surfaces of the first and second piezoelectric sheets, and the second electrode may be formed on the second main surface opposite to the first main surfaces of the first and second piezoelectric sheets. In this case, the first electrode is the common electrode described above, and the second electrode is the divided electrode described above, wherein voltage is applied by the divided electrode in such a manner that the first and second piezoelectric sheets make reverse movement, whereby the vibration region can be made as the bimorph structure.

In the second embodiment, the common electrode is preferably connected to the ground.

In the piezoelectric speaker according to the present invention, the piezoelectric sheet preferably includes bonded first and second piezoelectric sheets. In this case, the first and second electrodes are formed on opposing first and second main surfaces of the first piezoelectric sheet and formed on opposing first and second main surfaces of the second piezoelectric sheet. Then, when voltage is applied by the divided electrode in such a manner that the first and second piezoelectric sheets make opposite movement, the vibration region can be made as the bimorph structure.

In the above-mentioned preferable embodiments, it is preferable that an electrode non-formation region located between the respective electrode portions for the divided electrode formed on the first piezoelectric sheet, and an electrode non-formation region located between the respective electrode portions for the divided electrode formed on the second piezoelectric sheet are not substantially overlapped with each other, when the piezoelectric sheet is seen through in the thickness direction thereof.

In the piezoelectric speaker according to the present invention, the piezoelectric sheet may have a laminated structure including first and second piezoelectric sheet layers bonded to each other through a bonding layer. In this case, the stretching axis of the first piezoelectric sheet layer and the stretching axis of the second piezoelectric sheet layer direct in the opposite directions. The first and second electrodes are respectively formed on the opposing first and second main surfaces of the piezoelectric sheet having the laminated structure. In this case also, the vibration region can be made as the bimorph structure.

In the piezoelectric speaker according to the present invention, the vibration region may be provided so as to be distributed in a plurality of portions on the common piezoelectric sheet. With this configuration, a compound speaker can be integrally formed. In this case, if the patterns and the sizes of the first and second electrodes respectively formed on each of the plurality of vibration regions are the same, a stereo speaker can integrally be formed, for example, and on the other hand, if at least one of the patterns and the sizes of the first and second electrodes respectively formed on each of the plurality of vibration regions are different from each other, a 2-way or 3-way speaker can integrally be formed, for example.

The chiral polymer constituting the piezoelectric sheet is preferably poly-L-lactic-acid.

The first and second electrodes preferably include a layer mainly containing at least one type of indium tin oxide, indium zinc oxide, and zinc oxide, or include a layer made of at least one of polythiophene conductive polymer and polyaniline conductive polymer. More preferably, the first and second electrodes have a structure in which a layer mainly containing zinc oxide and a layer made of polythiophene conductive polymer are overlapped with each other as viewed in the lamination direction of the laminated body.

The present invention is also directed to a speaker apparatus including a frame and a piezoelectric speaker arranged on a front surface of the frame. The speaker apparatus according to the present invention is characterized by including the above-mentioned piezoelectric speaker according to the present invention as the piezoelectric speaker.

In the speaker apparatus according to the present invention, it is preferable that the frame can be hung on a wall.

The present invention is also directed to a tactile feedback apparatus having the piezoelectric speaker according to the present invention on a surface of a touch panel.

According to the present invention, even when the whole circumference of the piezoelectric speaker, in particular, the whole circumference of the vibration region is fixed, the vibration region can appropriately be vibrated to make a sound. When the piezoelectric speaker is rectangle, for example, the vibration region can appropriately be vibrated even with the state in which its four sides are fixed. Therefore, in the piezoelectric speaker, and the speaker apparatus provided with the same, the degree of freedom in design is increased, whereby it can make a sound even if it is in a completely plane state.

Since the present invention has a structure including a laminated body obtained by bonding a plurality of sheets, each being made of a polymer, to each other, the processing is easy. Therefore, it can promptly cope with the design change with reduced cost, and it can be suitable for a high-mix low-volume production.

In the piezoelectric speaker according to the present invention, when the divided electrode includes the fifth to eighth electrode portions distributed on the central portion of the vibration region in addition to the first to fourth electrode portions, the area of the maximum displacement region can be increased, whereby it can make a sound more efficiently. Further, since the electrodes can be formed on substantially the whole region of the piezoelectric sheet, a feeling of strangeness caused by the visual difference between the electrode formation portions and the electrode non-formation portions can be eased.

According to the present invention, the vibration region can appropriately be vibrated to make a sound even with the state in which the whole circumference of the vibration region is fixed, so that the vibration regions can be distributed on a plurality of portions on the common piezoelectric sheet. Accordingly, a stereo speaker, a speaker array, a 2-way or 3-way speaker can integrally be formed.

When the first embodiment is employed in which the first and second electrodes are the divided electrodes, the voltage needed to generate a predetermined displacement can relatively be reduced.

On the other hand, the second embodiment is employed in which only one of the first and second electrodes is the divided electrode, and the other one is a uniform common electrode commonly opposing to the plurality of electrode portions forming the divided electrode, a wiring structure for supplying a signal can be simplified compared to the first embodiment. In the second embodiment, if the common electrode is connected to the ground, an influence such as a noise can be reduced.

In the present invention, when electrode non-formation regions located between the respective electrode portions constituting the divided electrode are not substantially overlapped with each other, as at least two divided electrodes are seen through the piezoelectric sheet in the thickness direction thereof, in a case where at least two divided electrodes are arranged so as to be overlapped with each other in the thickness direction of the piezoelectric sheet, the concentration of stress on the electrode non-formation regions caused when the piezoelectric speaker is driven is eased, with the result that the break of the piezoelectric sheet can be prevented. Further, a feeling of strangeness caused by the visual difference between the electrode formation portions and the electrode non-formation portions can be eased.

In the present invention, when a poly-L-lactic-acid is used as a helical polymer constituting the piezoelectric sheet, a piezoelectric sheet having excellent transparency can be obtained, with the result that the transparency of the piezoelectric speaker can be enhanced. According to the poly-L-lactic-acid, stable piezoelectricity with a great piezoelectric constant can be realized. Further, the polylactic acid is a carbon neutral, and biodegradable, so that it is preferable from the viewpoint of the protection of the global environment.

When the first and second electrodes include a layer mainly containing indium tin oxide, indium zinc oxide, or zinc oxide, the piezoelectric speaker can be made transparent, if the piezoelectric sheet has transparency. Since the indium tin oxide, indium zinc oxide, and zinc oxide have high conductivity, the power consumption of the piezoelectric speaker can be reduced.

When the first and second electrodes include a layer made of at least one of a polythiophene conductive polymer and polianiline conductive polymer, the first and second electrodes can be formed with reduced cost through a simple process, such as only an application, without requiring a complicated and expensive process such as sputtering. If the piezoelectric sheet has transparency, the piezoelectric speaker can be made transparent. Since the polythiophene conductive polymer and polianiline conductive polymer have relatively high conductivity, the power consumption of the piezoelectric speaker can be reduced. Further, since the polythiophene conductive polymer and polianiline conductive polymer are soft, they cannot substantially hinder the deformation or vibration of the piezoelectric sheet.

According to the speaker apparatus of the present invention, the piezoelectric speaker is arranged on the front surface of the frame having a painting therein, whereby a speaker apparatus having high interior performance can be configured.

When the frame can be hung on a wall in the speaker apparatus according to the present invention, it can be configured such that a speaker portion for a television receiver in which a display portion is a wall-mounted type is configured by the speaker apparatus according to the present invention, and this can be hung on a wall as arranged with the display portion side by side, whereby uniform design can easily be realized, and the display portion can be more thin-sized, because it becomes unnecessary to incorporate the speaker therein.

In the tactile feedback apparatus according to the present invention, the piezoelectric speaker according to the present invention can be used as a vibrating plate that vibrates with a specific frequency, whereby the vibration, which can be a pseudo click feeling, can be transmitted to fingers only by mounting the piezoelectric speaker on a touch panel as it is. Accordingly, a component such as an actuator is not needed, so that the tactile feedback apparatus can easily be configured.

Figure 1:
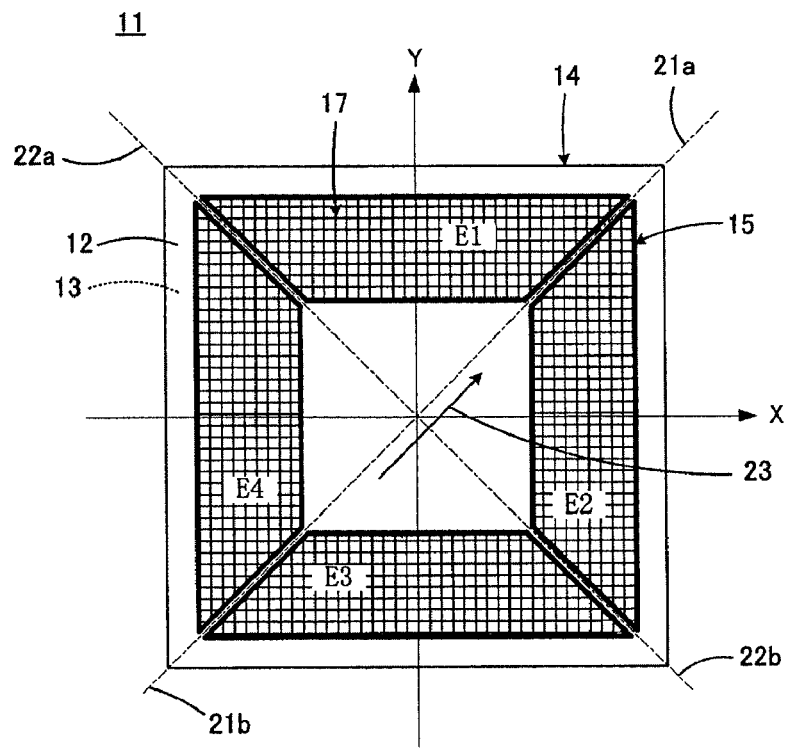
FIG. 1 is a plan view illustrating a piezoelectric speaker 11 according to a first embodiment of the present invention.

DESCRIPTION OF REFERENCE SYMBOLS 11, 11a to 11y Piezoelectric speaker
12, 13, 81 Piezoelectric sheet
14, 14a Stacked body
15, 41, 42, 45, 46, 47 Vibration region
16 to 19, 16a, 18a, 71, 85, 86, 86a Electrode
E1 First electrode portion
E2 Second electrode portion
E3 Third electrode portion
E4 Fourth electrode portion
E5 Fifth electrode portion
E6 Sixth electrode portion
E7 Seventh electrode portion
E8 Eighth electrode portion
20, 82 Bonding layer
21a, 21b, 22a, 22b Dividing line
23 Stretching axis
25a, 25b Electric field vector
26 to 30, 26a to 29a Connection line
51 Wall-hanging television receiver
61 Alternating-current signal supplying source
62 to 65, 62a to 65a Power supplying line
83, 84 Piezoelectric sheet layer

DETAILED DESCRIPTION OF THE INVENTION

Figure 2:
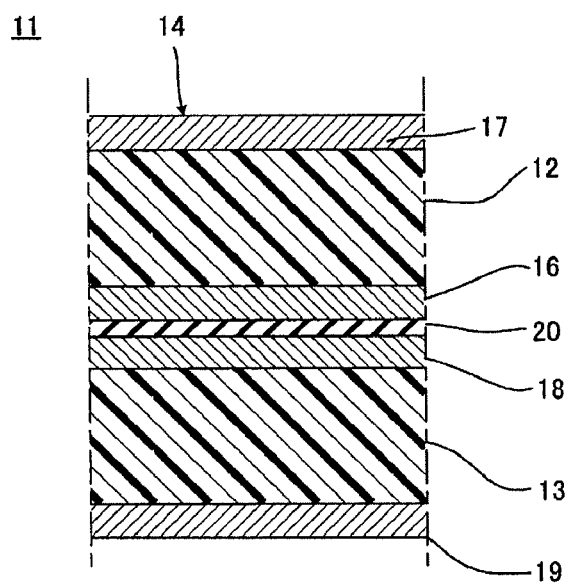
FIG. 2 is a sectional view illustrating a part of the piezoelectric speaker 11 illustrated in FIG. 1 as being enlarged.

FIG. 1 is a plan view illustrating a piezoelectric speaker 11 according to a first embodiment of the present invention. FIG. 2 is a sectional view illustrating a part of the piezoelectric speaker 11 illustrated in FIG. 1 as being enlarged.

The piezoelectric speaker 11 includes a laminated body 14 having two square sheets 12 and 13, each being made of a polymer, bonded to each other. In the present embodiment, the two sheets 12 and 13 are both piezoelectric sheets having a predetermined stretching axis and made of a chiral polymer. The detail of the piezoelectric sheet having the predetermined stretching axis and made of the chiral polymer will be described later.

Vibration regions 15 that should be vibrated are provided on the respective piezoelectric sheets 12 and 13. First and second electrodes 16 and 17 are provided with the same pattern on first and second main surfaces, which are opposite to the vibration regions 15 on the piezoelectric sheet 12, in order to apply voltage to the piezoelectric sheet 12, while first and second electrodes 18 and 19 are provided with the same pattern on first and second main surfaces, which are opposite to the vibration regions 15 on the piezoelectric sheet 13, in order to apply voltage to the piezoelectric sheet 13.

The respective first electrodes 16 and 18 on the piezoelectric sheets 12 and 13 are positioned so as to be sandwiched between the two piezoelectric sheets 12 and 13, while the second electrodes 17 and 19 are positioned at the outer side of the two piezoelectric sheets 12 and 13. The first electrode 16 and the first electrode 18 are bonded to each other with a bonding layer 20 interposed therebetween. In order to form the bonding layer 20, a transparent epoxy-based adhesive agent, acrylic adhesive agent, vinyl acetate adhesive agent, or adhesive agent based on these agents, or transparent ultraviolet cure adhesive agent is used, and it is preferable that it is pressed to be bonded in order to prevent air bubbles from entering therein with the use of a laminator.

Although a driving method of the piezoelectric speaker 11 will be described later, the electrodes 16 and 18 may be short-circuited, when the first electrode 16 and the first electrode 18 always have the same potential during the driving of the piezoelectric speaker 11. On the contrary, when the electrode 16 and the electrode 18 do not have the same potential, it is necessary to provide electric isolation between the electrode 16 and the electrode 18 by the bonding layer 20.

The respective first and second electrodes 16 to 19 include first to fourth electrode portions that are divided by a plurality of dividing lines extending in the radiation direction, wherein the first to fourth electrode portions are distributed along the outer peripheral portion of the vibration region 15 except for the central portion. This state in the second electrode 17 formed on the second main surface of the piezoelectric sheet 12 is illustrated in FIG. 1. As illustrated in FIG. 1, the second electrode 17 formed on the second main surface of the piezoelectric sheet 12 includes first to fourth electrode portions E1, E2, E3, and E4 divided by a plurality of dividing lines 21a, 21b, 22a, and 22b extending in the radiation direction, wherein the first to fourth electrode portions E1 to E4 are distributed along the outer peripheral portion of the vibration region 15 except for the central portion. In this embodiment, the dividing line 21a and the dividing line 21b are positioned on the same straight line, while the dividing line 22a and the dividing line 22b are positioned on the same straight line.

Although not illustrated, the first electrode 16 formed on the first main surface of the piezoelectric sheet 12, and the first and second electrodes 18 and 19 formed respectively on the first and second main surfaces of the piezoelectric sheet 13 have the pattern similar to that of the electrode 17 illustrated in FIG. 1. Therefore, the reference symbols "E1", "E2", "E3", and "E4" may sometimes be used for the first to fourth electrode portions of the respective electrodes 16, 18, and 19.

A stretching axis 23 is illustrated in FIG. 1. In this embodiment, the stretching axis 23 has an angle of 45 degrees with respect to one side of the piezoelectric sheets 12 and 13. The dividing lines 21a and 21b have an angle of 0 degrees with respect to the stretching axis 23, and the dividing lines 22a and 22b have an angle of 90 degrees with respect to the stretching axis 23. The stretching axis 23 means an axis oriented in the direction of stretching applied to the piezoelectric sheets 12 and 13, and when they are stretched in a plurality of directions as in the case of biaxial stretching, it means an axis oriented in the direction in which they are stretched with the maximum stretch ratio.

When this piezoelectric speaker 11 is driven, voltage is applied between the first and second electrodes 16 and 17 in the piezoelectric sheet 12, and voltage is applied between the first and second electrodes 18 and 19 in the piezoelectric sheet 13, wherein voltage is applied to the first to fourth electrode portions E1 to E4 in such a manner that vectors of electric field generated in the thickness direction of the piezoelectric sheets 12 and 13 direct in the opposite directions between the adjacent ones of the first to fourth sheet portions of the piezoelectric sheets 12 and 13 to which the voltage is respectively applied by the first to fourth electrode portions E1 to E4.

Figure 3:
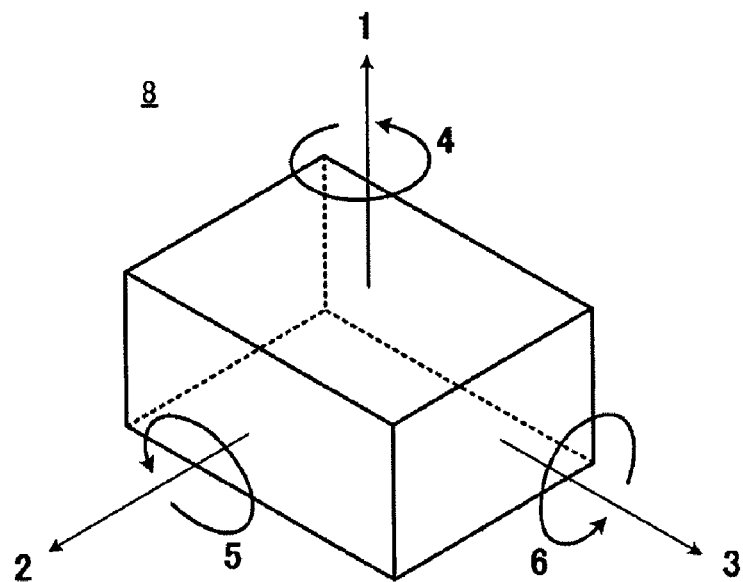
FIG. 3 is a view for describing a relationship among a direction of a stretching axis, a direction of an electric field, and a strain direction in the piezoelectric sheet 8 made of poly-L-lactic acid.

The piezoelectric sheets 12 and 13 have the predetermined stretching axis 23, and are made of chiral polymer as described above. In this embodiment, poly-L-lactic-acid (PLLA) is used as the chiral polymer. Japanese Unexamined Patent Publication No. 5-152638 discloses that a piezoelectric sheet having a piezoelectric constant $d_{14}$ is obtained by stretching the sheet made of the chiral polymer such as PLLA, for example. Specifically, as illustrated in FIG. 3, when electrodes are formed on upper and lower surfaces in the figure of a piezoelectric sheet 8 made of a chiral polymer such as PLLA, and stretching is executed in "3" axis direction, strain is produced in "4" axis direction that is the rotating direction of "1" axis, when electric field is applied in the direction of the "1" axis direction that is the normal direction of the electrode surface.

The piezoelectric constant of the PLLA belongs to a rather great category of the polymers. Since a point group of PLLA crystal is $D_2$, there are components of $d_{14}$, $d_{25}$, and $d_{36}$, and in the stretched piezoelectric sheet 8, $d_{25}=-d_{14}$, and $d_{36}=0$, whereby a so-called strain piezoelectric property in which the strain is produced in the rotating direction "4" of the normal direction "1" of the electrode surface is exhibited as described above. The PLLA exhibits piezoelectricity only in the stretching, and a poling process, which is required for the other polymers (e.g., polyvinylidene fluoride: PVDF) or a piezoelectric ceramic, is unnecessary. In the case of the PVDF, the phenomenon in which the piezoelectric constant reduces with time appears, but in the case of the PLLA, the piezoelectricity can stably be kept.

The transparency of the PLLA is very high, and light transmittance of a pure PLLA reaches as high as 94%. This is the value exceeding 93%, which is the light transmittance of polymethylmethacrylate that can be said to have the highest transmittance of the polymers.

Since the PLLA is a resin manufactured by using a cone as a material, unnecessary carbon dioxide is hardly discharged during the manufacture, so that it is a material having less environmental load, i.e., it has biodegradability, and it reverts back to nature when it is wasted.

Figure 4:
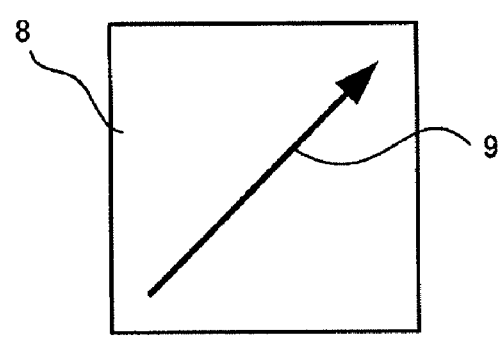
FIG. 4 is a plan view illustrating the piezoelectric sheet 8 illustrated in FIG. 3.

FIG. 4 is a plan view illustrating the piezoelectric sheet 8 illustrated in FIG. 3. The piezoelectric sheet 8 is composed of the PLLA sheet as described above. The illustrated piezoelectric sheet 8 has a stretching axis 9 extending in the direction of 45 degrees with respect to one side thereof. A PLLA sheet after a cast molding can generally exhibit piezoelectricity by being stretched 2 to 6 times. When an inorganic substance with a predetermined nanosize is mixed in the PLLA sheet beforehand, the piezoelectricity of the PLLA sheet can be enhanced without substantially deteriorating the transparency.

Figure 5A:
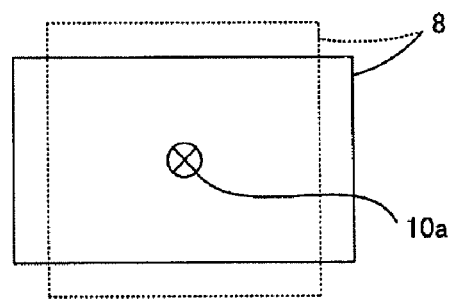
FIGS. 5(a) and 5(b) are views illustrating the deformation manner of the piezoelectric sheet 8 illustrated in FIG. 4 when an electric field is applied.
Figure 5B:
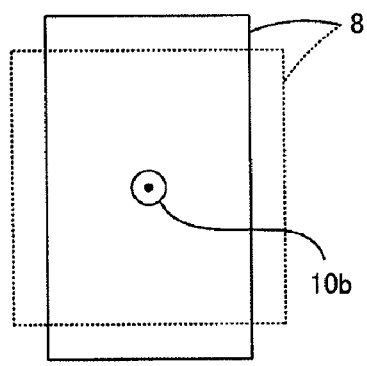

When electrodes (not illustrated) are formed on the respective main surfaces of the piezoelectric sheet 8 made of the PLLA, and voltage is applied thereto, a deformation is produced as illustrated in FIGS. 5(a) and 5(b) due to the effect of the piezoelectric constant $d_{14}$. Specifically, the sheet is deformed into the state indicated by a solid line from the original state indicated by a broken line in FIGS. 5(a) and 5(b).

In FIGS. 5(a) and 5(b), electric field vectors 10a and 10b produced by the applied voltage are illustrated. The electric field vector 10a illustrated in FIG. 5(a) is an electric field directing from the near side to the far side on the paper plane, while the electric field vector 10b illustrated in FIG. 5(b) is an electric field directing from the far side to the near side on the paper plane. When the voltage represented by the electric field vector 10a is applied, the piezoelectric sheet 8 is deformed as illustrated in FIG. 5(a), and when the voltage represented by the electric field vector 10b is applied, the piezoelectric sheet 8 is deformed as illustrated in FIG. 5(b).

The deformation of the piezoelectric sheet 8 as illustrated in FIGS. 5(a) and 5(b) is applied to one of the piezoelectric sheets, e.g., the piezoelectric sheet 12, provided to the speaker 11 illustrated in FIGS. 1 and 2, and this is described below.

Referring to FIG. 1, it is supposed that a ground potential or a minus potential (a plus potential to the electrode portions at the back side thereof) is applied to the first and third electrode portions E1 and E3, and a plus potential (a ground potential or a minus potential to the electrode portions at the back side thereof) is applied to the second and fourth electrode portions E2 and E4.

In this case, the first and third sheet portions of the piezoelectric sheet 12, to which voltage is applied by the first and third electrode portions E1 and E3, exhibit the displacement in which they are stretched along the X-axis direction and contracted along the Y-axis direction due to the effect of the piezoelectric constant $d_{14}$. On the other hand, the second and fourth sheet portions of the piezoelectric sheet 12, to which voltage is applied by the second and fourth electrode portions E2 and E4, exhibit the displacement in which they are contracted along the X-axis direction and stretched along the Y-axis direction.

Figure 6:
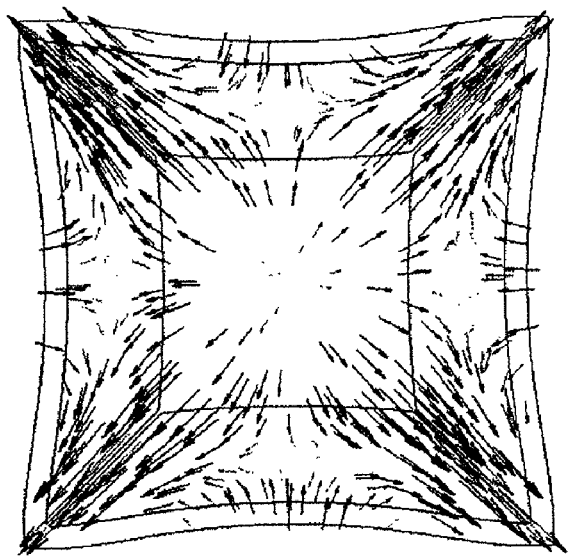
FIG. 6 is a view illustrating the displacement generated when a predetermined potential is applied to piezoelectric sheet 12 provided to the piezoelectric speaker 11 illustrated in FIG. 1.

FIG. 6 shows the result obtained by calculating the displacement described above with the use of a finite element method. In this calculation, any sides are free in order to represent a free displacement.

In FIG. 6, vectors represent the displacement direction of the piezoelectric sheet 12. As illustrated in FIG. 6, it is found that the displacement in which the sheet tends to stretch outward is great in the region along the diagonal line, while the displacement in which the sheet tends to contract toward the central portion is present at four sides of the outer periphery. It is to be noted that the displacement is more exaggeratingly illustrated than the actual one.

Although connection electrodes or connection lines for applying a predetermined potential to the electrode portions E1 to E4 are provided on the piezoelectric sheets 12 and 13 or at the outside, these are not illustrated in the figure.

Next, the potential applied to the electrode portions E1 to E4 are reversed. Specifically, a plus potential (a ground potential or a minus potential to the electrode portions at the back side thereof) is applied to the first and third electrode portions E1 and E3, while a ground potential or a minus potential (a plus potential to the electrode portions at the back side thereof) is applied to the second and fourth electrode portions E2 and E4.

In this case, the first and third sheet portions of the piezoelectric sheet 12, to which voltage is applied by the first and third electrode portions E1 and E3, exhibit the displacement in which they are stretched along the Y-axis direction and contracted along the X-axis direction due to the effect of the piezoelectric constant $d_{14}$. On the other hand, the second and fourth sheet portions of the piezoelectric sheet 12, to which voltage is applied by the second and fourth electrode portions E2 and E4, exhibit the displacement in which they are contracted along the Y-axis direction and stretched along the X-axis direction.

Figure 7:
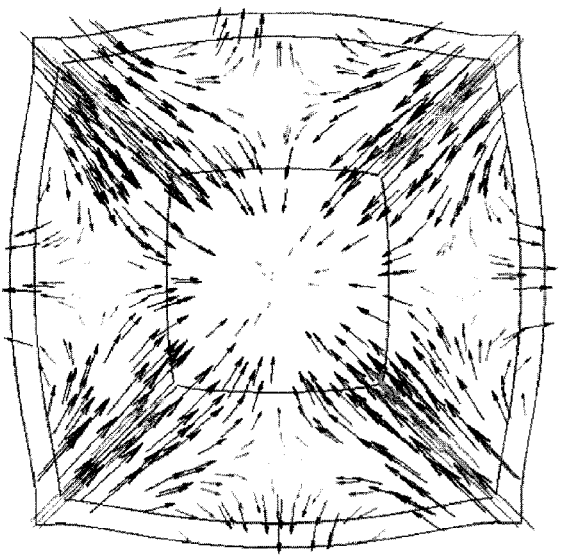
FIG. 7 is a view illustrating the displacement generated when the potential reverse to the potential in FIG. 6 is applied to the piezoelectric sheet 12 provided to the piezoelectric speaker 11 illustrated in FIG. 1.

FIG. 7 shows the result obtained by calculating the displacement described above with the use of a finite element method. FIG. 7 is a diagram corresponding to FIG. 6.

As illustrated in FIG. 7, it is found that the displacement in which the sheet tends to contract inward is great in the region along the diagonal line, while the displacement in which the sheet tends to stretch toward the outside is present at four sides of the outer periphery.

The displacement similar to that of the piezoelectric sheet 12 is generated on the piezoelectric sheet 13 provided to the piezoelectric speaker 11 illustrated in FIGS. 1 and 2.

Figure 8:
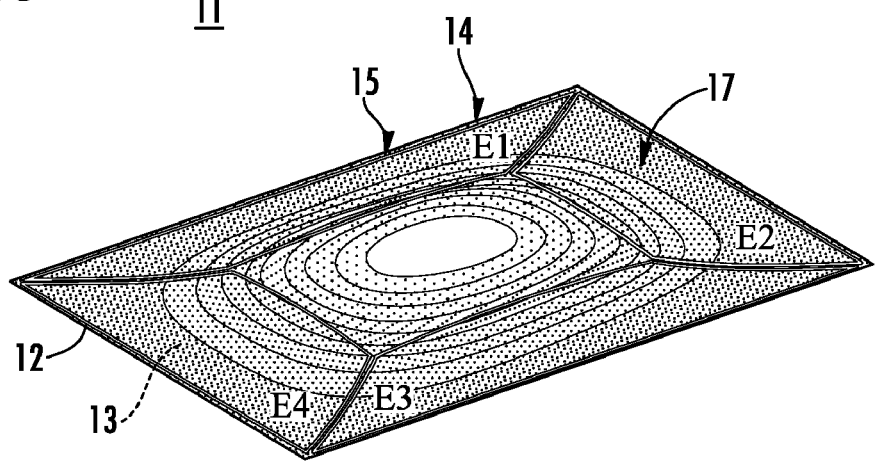
FIG. 8 is a perspective view illustrating the displacement in the state in which the outer peripheral portion of the piezoelectric speaker 11 illustrated in FIG. 1 is completely fixed.

If the two piezoelectric sheets 12 and 13 on which the displacement described above is generated are laminated and formed into a bimorph type illustrated in FIG. 2 so as to compose the piezoelectric speaker 11, only a central portion vibrates as illustrated in FIG. 8, even if four sides are fixed, whereby a vibration mode suitable for forming an acoustic wave can be acquired. FIG. 8 illustrates the displacement, calculated according to a finite element method, of an embodiment having four sides completely fixed. FIG. 8 indicates that the portion having lighter color swells. The similar expression is used for the other similar drawings described later. The displacement amount is expressed more exaggeratingly than the actual one.

FIG. 2 is a sectional view illustrating an optional portion where the electrodes 16 to 19 are present on the piezoelectric speaker 11.

Referring to FIG. 2, when the respective stretching axes 23 (see FIG. 1), i.e., the vectors in the stretching direction, of the piezoelectric sheets 12 and 13 direct in the same direction, and the sheets are laminated without inversing the vertical relationship of the front surface and the back surface during the stretching, the relationship of the electrode potential during the vibration operation becomes as described below.

When the predetermined portion of the electrode 17 has a plus potential, the corresponding portions of the electrodes 16 and 18 have a ground potential (or minus potential), and the corresponding portion of the electrode 19 has a plus potential. When the predetermined portion of the electrode 17 has a ground potential (or minus potential), the corresponding portions of the electrodes 16 and 18 have a plus potential, and the corresponding portion of the electrode 19 has a ground potential (or minus potential). In summary, it is suffice to apply the electric field vectors in the opposite directions to the piezoelectric sheet 12 and the piezoelectric sheet 13, and the plus and the ground (or minus) of the potential is not restricted, so long as it is in accordance with this rule.

When the vectors in the stretching directions of the respective piezoelectric sheet 12 and the piezoelectric sheet 13 are set to have an angle of 90 degrees, and the sheets are laminated without inversing the vertical relationship of the front surface and the back surface during the stretching, the piezoelectric sheet 12 and the piezoelectric sheet 13 make an operation reverse to each other, which means a bimorph vibration is obtained, by applying the potential to the piezoelectric sheet 12 and the piezoelectric sheet 13 so as to set the electric field vectors to direct in the same direction.

When the vectors in the stretching directions of the piezoelectric sheet 12 and the piezoelectric sheet 13 direct in the same direction, and the sheets are laminated with the vertical relationship of the front surface and the back surface being inversed during the stretching, the piezoelectric sheet 12 and the piezoelectric sheet 13 make an operation reverse to each other, which means a bimorph vibration is obtained, by applying the potential to the piezoelectric sheet 12 and the piezoelectric sheet 13 so as to set the electric field vectors to direct in the same direction.

When the vectors in the stretching directions of the piezoelectric sheet 12 and the piezoelectric sheet 13 are set to have an angle of 90 degrees with respect to each other, and the sheets are laminated with the vertical relationship of the front surface and the back surface being inversed during the stretching, the piezoelectric sheet 12 and the piezoelectric sheet 13 make an operation reverse to each other, which means a bimorph vibration is obtained, by applying the electric field vectors in the opposite direction to the piezoelectric sheet 12 and the piezoelectric sheet 13.

When the piezoelectric sheets 12 and 13 are made of the PLLA as described in the present embodiment, a stable piezoelectricity can be obtained, and excellent transparency can be obtained, for the piezoelectric sheets 12 and 13. However, if the advantage described above is not particularly desired, a chiral polymer other than the PLLA may be used for the material of the piezoelectric sheets 12 and 13. For example, poly-γ-methyl-L-glutamate, or poly-γ-benzil-L-glutamate may be used for the material of the piezoelectric sheets 12 and 13, for example.

A spiral structure is not always formed, if a monomer having chirality (enantiomerism) becomes a polymer. In the case of a biological polymer, one of those in the enatiometric relationship is referred to as an L body, while the other is referred to as a D body. When the L body becomes a helical polymer, the D body also becomes the helical polymer, wherein its helical direction is inversed. Since the polymers having the L polymer and the D polymer mixed with each other in 50% each are in the relation in which they are canceled with each other, it exhibits neither optical rotation nor piezoelectricity.

When even a monomer not having chirality is polymerized to become a polymer exhibiting the helical structure, this polymer has chirality. Glutamic acid and lactic acid include asymmetric carbon in the monomer, so that they have chirality, and become a helical polymer (chiral polymer). Poly-L-lactic-acid is synthesized due to the action of microorganisms from starch during the synthesis of polylactic acid. Therefore, the polylactic acid generally handled is poly-L-lactic-acid (PLLA).

The electrodes 16 to 19 are preferably made of a material mainly containing at least one of indium tin oxide, indium zinc oxide, and zinc oxide. The materials described above have transparency, so that if the piezoelectric sheets 12 and 13 have transparency, transparency can be provided to the piezoelectric speaker 11. When the piezoelectric sheets 12 and 13 are made of the PLLA, in particular, high transparency can be achieved in the piezoelectric speaker 11. When the piezoelectric speaker 11 is for an application not requiring the transparency, the electrodes 16 to 19 may be made of a material having no transparency.

The electrodes 16 to 19 are also preferably made of a polythiophene conductive polymer or aniline conductive polymer. These conductive polymers are soft, so that they cannot substantially hinder the deformation or vibration of the piezoelectric sheets 12 and 13.

When an organic material is used for forming the electrodes 16 to 19, a simple application can be employed. When a material of zinc oxide is used, a sputtering can be employed. When a metal is used, vapor-deposition, sputtering, plating, and adhesion of a thin film can be employed.

More preferably, the electrodes 16 to 19 are formed to have a configuration in which a layer mainly containing zinc oxide (hereinafter referred to as a "zinc-oxide electrode layer") and a layer made of a polythiophene conductive polymer (hereinafter referred to as "polythiophene electrode layer") are overlapped with each other as viewed in the lamination direction of the laminated body 14. The reason thereof is as stated below.

The zinc-oxide electrode layer exhibits transmittance of 80% or more for light in the visible region of 400 to 800 nm, but the transmittance is reduced in the short wavelength region of less than 400 nm, whereby it is transparent, but slightly yellowish. On the other hand, the polythiophene electrode layer is transparent, but slightly bluish. When the configuration in which the zinc-oxide electrode layer and the polythiophene electrode layer are overlapped with each other is realized, a tone of the transmitted light passing through the respective electrode layers is in accordance with a subtractive mixture. Accordingly, the transmitted light becomes a product of the respective transmittances of the zinc-oxide electrode layer and the polythiophene electrode layer, and the present inventors have found that the spectral characteristic in the visible light region is almost flat in this case. With this, the coloring of the transmitted light is prevented, whereby it can be clear and colorless. This will be described later more specifically with reference to FIG. 9.

Accordingly, when the first electrodes 16 and 18 are made of the zinc-oxide electrode layer, and the second electrodes 17 and 19 are made of the polythiophene electrode layer, the configuration in which the zinc-oxide electrode layer and the polythiophene electrode layer are overlapped with each other can be realized, whereby the coloring of the transmitted light is prevented, and it can be clear and colorless.

The effects described below are obtained, when the first electrodes 16 and 18 are made of the zinc-oxide electrode layer, and the second electrodes 17 and 19 are made of the polythiophene electrode layer as described above.

When the temperature of the PLLA constituting the piezoelectric sheets 12 and 13 becomes not less than a glass transition point, the piezoelectricity is lost, but when the temperature lowers, it is returned to the state having the original piezoelectric constant, as described above. As for the temperature rise, an actual operating temperature is supposed, and it is not supposed that the temperature becomes 85° C. or more. However, as described above, when the temperature lowers to cause the deformation (contraction) in this case, the stretching effect is changed to entail the reduction in the piezoelectric constant. The zinc-oxide electrode layer has hardness of a certain degree, even if it is a thin film, so that the deformation (contraction) of the piezoelectric sheets 12 and 13 made of the PLLA can be prevented by forming the first electrodes 16 and 18 made of the zinc-oxide electrode layer on the piezoelectric sheets 12 and 13 made of the PLLA, whereby the heat resistance of the piezoelectric speaker 11 can be enhanced.

When the first electrodes 16 and 18 made of the zinc-oxide electrode layer are located so as to be sandwiched between the two piezoelectric sheets 12 and 13, and the second electrodes 17 and 19 made of the polythiophene electrode layer are located at the outer side of the respective two piezoelectric sheets 12 and 13, the relatively hard zinc-oxide electrode layer is located at the portion where the mechanical stretching and contraction at the vibration region 15 of the piezoelectric speaker 11 becomes the smallest, and the polythiophene electrode layer that is easy to be stretched and contracted is located at the portion where the mechanical stretching and contraction becomes the greatest, with the result that the factor for hindering the bending vibration at the vibration region 15 can be reduced.

In order to realize the configuration in which the zinc-oxide electrode layer and the polythiophene electrode layer are overlapped with each other, each of the electrodes 16 to 19 can be configured to include a two-layer structure of the zinc-oxide electrode layer and the polythiophene electrode layer. In this case, it is preferable that the zinc-oxide electrode layer is formed at the side closer to the piezoelectric sheets 12 and 13, while the polythiophene electrode layer is formed at the side apart from the piezoelectric sheets 12 and 13.

With this configuration, the deformation such as the contraction due to the heat of the piezoelectric sheets 12 and 13 can effectively be prevented by the zinc-oxide electrode layer. Further, even if microcracks are produced on the zinc-oxide electrode layer that repeatedly stretches and contracts when the piezoelectric speaker 11 is driven, the polythiophene electrode layer covers the zinc-oxide electrode layer, whereby there is no chance that the electrical break, which is a fatal defect, occurs. Since the zinc-oxide electrode layer has conductivity dozens of time as high as that of the polythiophene electrode layer, the piezoelectric speaker 11 can be driven with reduced power consumption.

The zinc-oxide electrode layer is preferably made of zinc oxide that has a crystal structure in which c axes grow in a plurality of different directions, and that has doped thereto at least one type of Ga, Al, and In at a doping concentration of 7 to 40% by weight in terms of each oxide conversion. A film obtained by doping at least one type of Ga, Al, and In, which are IIIB group element, to the zinc oxide at high concentration of 7% by weight or more with a magnetron sputtering method of an off-axis type has a crystal structure greatly different from that of a conventional columnar-growth c-axis orientation film. The zinc-oxide film doped with high concentration has a unique crystal form in which c faces, which are the stable surfaces, grow in the various directions, and since a three-dimensional grain network is formed, the grain diffusion of $H_2O$ is suppressed, and activation energy in the reaction (reoxidation reaction of oxygen defect) between $H_2O$ and ZnO is increased, thereby exhibiting excellent moisture resistance. Since the film can be formed at room temperature, the film formation on a polymer sheet having relatively low resistance to temperature compared to a ceramic or glass, i.e., on the piezoelectric sheets 12 and 13, can be progressed without any trouble.

On the other hand, examples of the polythiophene conductive polymer constituting the polythiophene electrode layer include polythiophene, or polyethylenedioxythiophene. These materials can be handled in the form of solution, and only when this solution is lightly applied and dried with a spin coating or ink jet printing, a film having conductivity can be formed. Accordingly, they are suitable for the formation of the electrode on the piezoelectric sheets 12 and 13 made of an organic polymer.

The thickness of each component constituting the piezoelectric speaker 11 is exaggeratingly illustrated in the cross-sectional structure of the piezoelectric speaker 11 illustrated in FIG. 2. For example, the actual thickness is such that the respective piezoelectric sheets 12 and 13 have a thickness of 0.05 to 0.1 mm, the first electrodes 16 and 18 made of the zinc-oxide electrode layer have a thickness of 50 to 100 mm, the second electrodes 17 and 19 made of the polythiophene electrode layer have a thickness of 0.3 to 2 µm, and the bonding layer 20 has a thickness of 1 to 10 µm. The thickness of each component is not limited to the range described above, and it can suitably be set according to the property value of each material.

As described above, since the electrodes 16 to 19 are very thin, they can be made substantially transparent, and the bonding layer 20 can be made transparent. Further, since the PLLA sheet that becomes the piezoelectric sheets 12 and 13 has high transparency, high transparency can be secured as the whole piezoelectric speaker 11.

Figure 9:
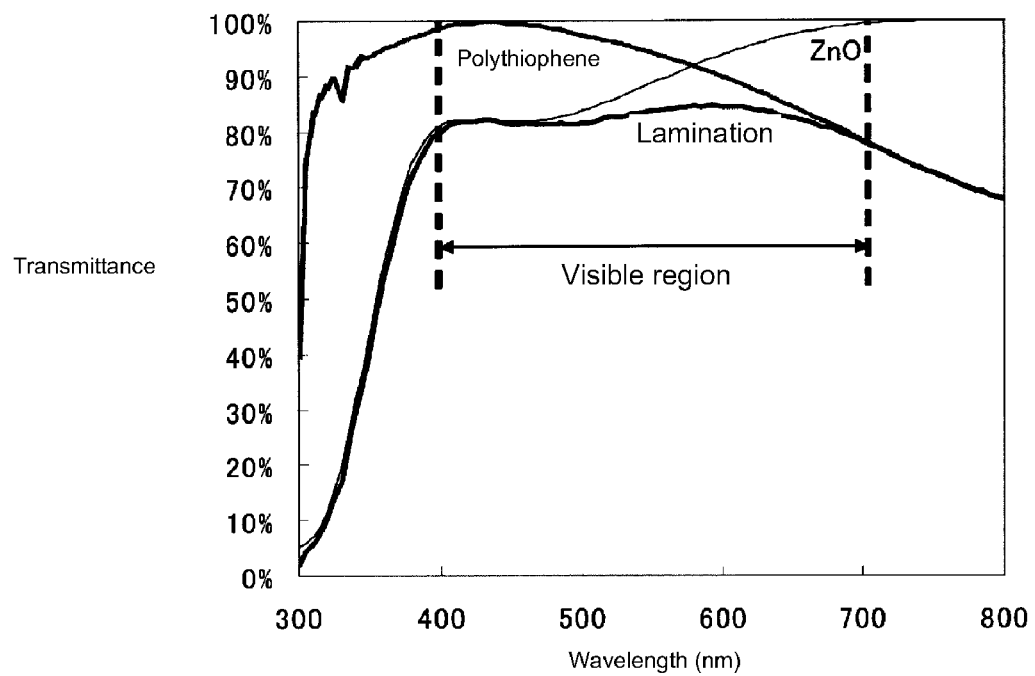
FIG. 9 is a view illustrating a relationship between a wavelength of light and light transmittance for a zinc-oxide electrode layer, a polythiophene electrode layer, and a structure obtained by laminating these layers.

FIG. 9 is a view illustrating a relationship between a wavelength of light and light transmittance for the zinc-oxide electrode layer, the polythiophene electrode layer, and a structure obtained by overlapping these layers. In FIG. 9, the zinc-oxide electrode layer is represented by "ZnO", the polythiophene electrode layer is represented by "polythiophene", and a structure obtained by overlapping these layers is represented by "Lamination".

In FIG. 9, the transmittance of each of the zinc-oxide electrode layer and the polythiophene electrode layer is standardized such that the maximum transmittance becomes 100%, wherein the amount corresponding to the loss due to the reflection is removed from the actual measured transmittance curve.

As illustrated in FIG. 9, the zinc-oxide electrode layer has great absorption in the region where the wavelength is 400 nm or less. Specifically, it has great absorption in the ultraviolet region. In the region of 400 to 450 nm, it has slightly greater absorption, compared to the other wavelength band. Specifically, light from violet to blue is slightly absorbed, compared to the light of the other colors. With this, yellow, which is its complementary color, is emphasized, so that the zinc-oxide electrode layer seems to be slightly yellowish.

On the other hand, the polythiophene electrode layer has a property in which the transmittance gently reduces toward the region having a longer wavelength by using the peak of the transmittance in the vicinity of the wavelength of 430 nm, as understood from FIG. 9. Therefore, the polythiophene electrode layer seems to be slightly bluish.

When the zinc-oxide electrode layer and the polythiophene electrode layer are overlapped with each other, the tone of the transmitted light is in accordance with the subtraction mixture. Therefore, the transmittance of the transmitted light becomes the product of the transmittances of the zinc-oxide electrode layer and the polythiophene electrode layer. As illustrated in FIG. 9, the transmittance curve of the "Lamination" is almost flat in the range of the visible region (380 nm to 700 nm), so that there is no tone. Specifically, it is understood that it can be colorless.

The degree of the coloring of the zinc-oxide electrode layer is slightly altered depending on the condition during the film formation, the amount of the element to be doped, the thickness, etc. These can be controlled, so that the desired degree of coloring can be realized. Similarly, the degree of coloring of the polythiophene electrode layer is slightly changed depending on the film-forming condition, thickness, etc. These can also be controlled, so that the desired degree of coloring can be realized. Therefore, the degree of coloring of the transmitted light can freely be controlled. Conversely, the condition for achromatization can be selected according to the respective conditions.

When a modification of the first embodiment described above is described with reference to FIG. 2, a configuration in which one of the first electrodes 16 and 18, e.g., the electrode 18, is eliminated is possible. In this case, the electric field vector is formed on the piezoelectric sheet 13 by the electrodes 16 and 19. The intensity of the electric field applied to the piezoelectric sheet 13 is slightly lowered by the amount corresponding to the sandwiched bonding layer 20, compared to the intensity of the electric field applied to the piezoelectric sheet 12. However, since the process of forming the electrode 18 can be skipped, cost can significantly be reduced, and since the electrode 18 is not present, the transparency can be enhanced.

The present invention has been described above in relation to the first embodiment, but various modifications are possible within the scope of the invention. The other embodiments of the present invention will be described below.

Figure 10:
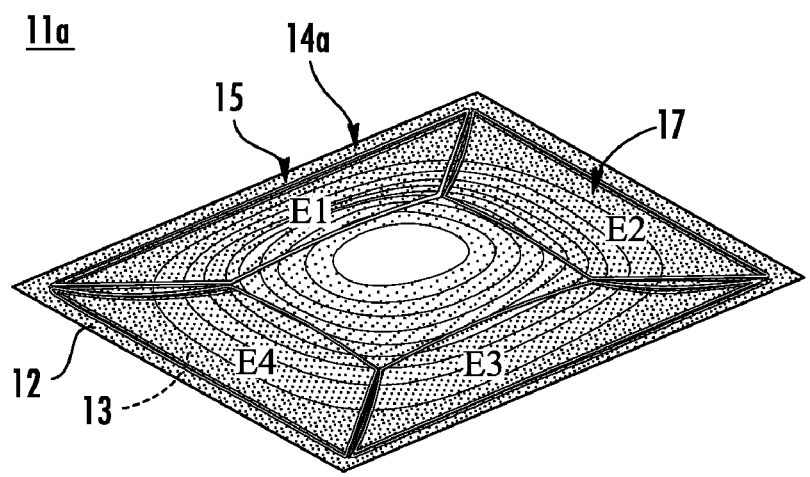
FIG. 10 is a perspective view corresponding to FIG. 8 and illustrating a piezoelectric speaker 11a according to a second embodiment of the present invention.

FIG. 10 is a diagram corresponding to FIG. 8 for describing a second embodiment of the present invention. In FIG. 10, the components corresponding to those illustrated in FIG. 8 are identified by the same symbols, and the repeated description will not be made.

A piezoelectric speaker 11a illustrated in FIG. 10 is characterized in that it does not have a bimorph structure, but has a unimorph structure. Specifically, although not clearly illustrated in FIG. 10, a laminated body 14a provided to a piezoelectric speaker 11a has a structure in which two sheets, which are made of a polymer, are bonded to each other, and only one sheet of two sheets is a piezoelectric sheet having electrodes formed on both main surfaces. As for the other sheet, even when it is made of the PLLA, for example, an electrode is not formed thereon. Since this sheet does not need to have piezoelectricity, it may be made of a polymer having high transparency other than the PLLA, such as polymethylmethacrylate, polycarbonate, or polyethylene terephthalate.

As illustrated in FIG. 10, the displacement similar to that in the piezoelectric speaker 11 of the bimorph structure illustrated in FIG. 8 can be produced even in the piezoelectric speaker 11a having the unimorph structure. In the piezoelectric speaker 11 having the bimorph structure illustrated in FIG. 8, the displacement is uniformly produced in the same direction, while in the piezoelectric speaker 11a having the unimorph structure illustrated in FIG. 10, the deformation is such that the surrounding of the projecting portion at the central portion is slightly depressed conversely. From the viewpoint of speaker performance, the piezoelectric speaker 11 having the bimorph structure illustrated in FIG. 8 is more excellent.

Figure 11:
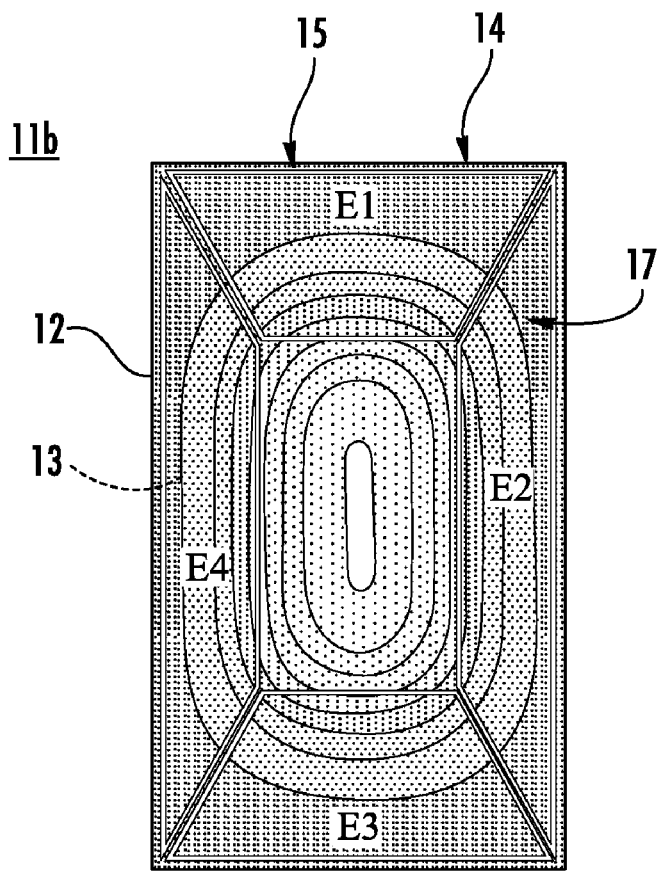
FIG. 11 is a plan view corresponding to FIG. 8 and illustrating a piezoelectric speaker 11b according to a third embodiment of the present invention.

FIG. 11 is a diagram corresponding to FIG. 8 for describing a third embodiment of the present invention. FIG. 8 is a perspective view, while FIG. 11 is a plan view. In FIG. 11, the components corresponding to those illustrated in FIG. 8 are identified by the same symbols, and the repeated description will not be made.

The piezoelectric speaker 11 illustrated in FIG. 8 has a square shape as well illustrated in FIG. 1, but a piezoelectric speaker 11b illustrated in FIG. 11 has a rectangular shape. In this manner, even in the piezoelectric speaker 11b having the rectangular shape, the substantially similar displacement can be produced as illustrated in FIG. 11. The piezoelectric speaker 11b having the rectangular shape is advantageously used in a cellular phone as described below.

Figure 12:
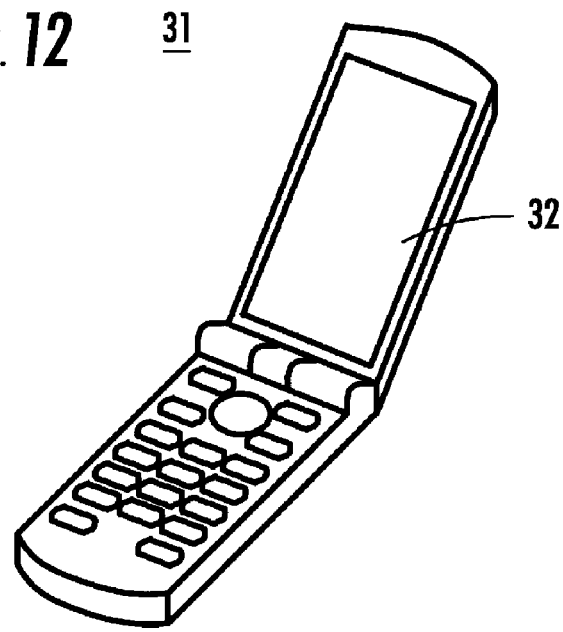
FIG. 12 is a perspective view illustrating a cellular phone 31 to which the piezoelectric speaker 11b illustrated in FIG. 11 is applied.

As illustrated in FIG. 12, most of cellular phones 31 used in Japan have a rectangular display surface 32. Since the piezoelectric speaker according to the present invention can be made transparent, it can be configured such that an image below the speaker can be visually confirmed, with the speaker being directly arranged on the display surface 32.

In the above-mentioned case, the shape of the piezoelectric speaker has to be matched to the shape of the display surface 32. When the piezoelectric speaker is made of a ceramic piezoelectric member, a mold has to be changed, if the shape is changed, which takes much cost. On the other hand, the piezoelectric speaker according to the present invention is composed of a sheet made of a polymer, whereby it can easily be cut with a cutter or the like, and hence, it can easily be formed into an optional shape.

Figure 13:
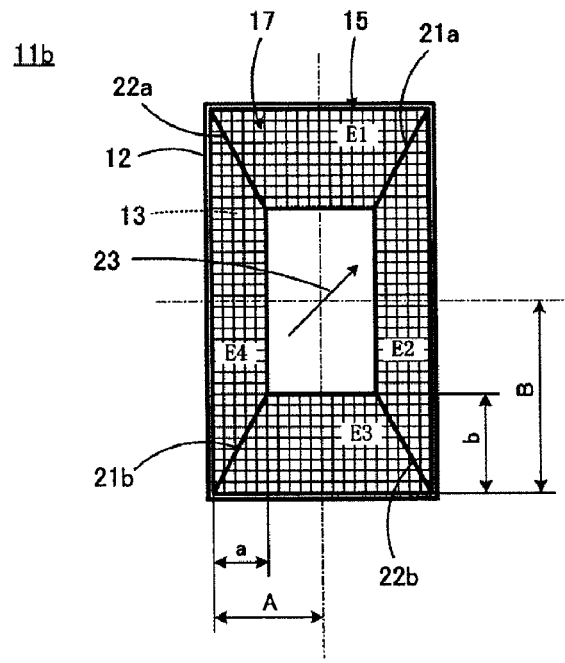
FIG. 13 is a view obtained by rewriting the piezoelectric speaker 11b illustrated in FIG. 11 for describing the electrode dimensional ratios a/A and b/B.

The dimensional ratio of the electrode will next be examined with reference to FIG. 13. In the piezoelectric speaker 11b illustrated in FIG. 11, a/A and b/B [%] as for the sizes A, a, B, and b illustrated in FIG. 13 are set to be 50%.

Figure 14:
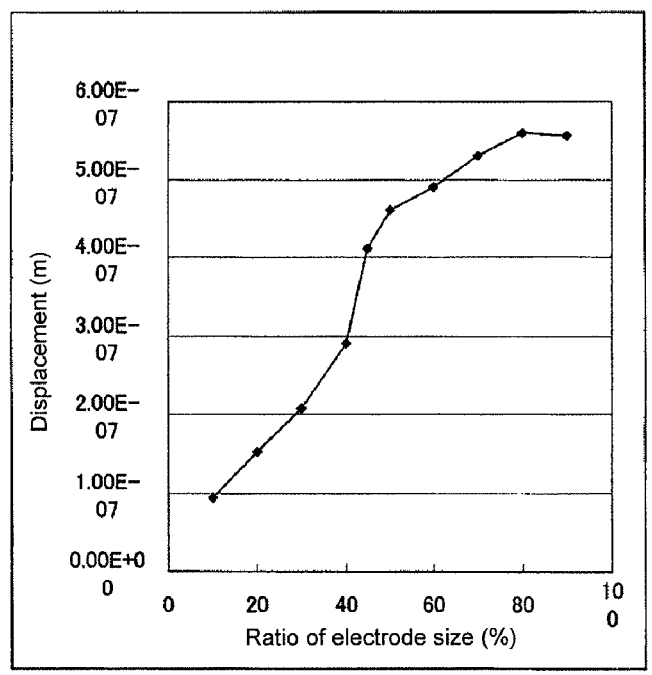
FIG. 14 is a view illustrating the relationship between the electrode dimensional ratios a/A and b/B and the displacement obtained based on the piezoelectric speaker 11b illustrated in FIG. 11.

FIG. 14 illustrates the result of the calculation of the relationship between the dimensional ratio (a/A, b/B) of the electrode and the displacement with the use of a static analysis simulation of a finite element method. The calculation model is set to be electrodes having an aspect ratio (2×B:2×A) of 7:4, which is close to the aspect ratio of the display surface of the actual cellular phone. The actual cellular phones mostly have the longitudinal size of about 60 to 70 mm, and the lateral size of about 40 to 50 mm, but in order to enhance the calculation speed of a simulator, the calculation is made for a small model having the longitudinal size of 35 mm, and the lateral size of 20 mm. A voltage is set to be 10 V, $d_{14}$ of the piezoelectric sheet is set such that $d_{14}$=20 pC/N, and $d_{25}$ thereof is similarly set such that $d_{25}$=−20 pC/N, and the thicknesses of two piezoelectric sheets are set to be 0.075 mm. ZnO is used for the electrode, and the thickness of the electrode is set to be 0.5 μm. The space between the electrode portions is set to be 0.3 mm.

It is found from the calculation result illustrated in FIG. 14 that the displacement sharply increases in the vicinity of 50%. Since the calculation model is small, the displacement amount is small, but in the actual size, the displacement of several micrometers is acquired. When resonance is used for actually making sounds, the displacement further increases, and the displacement of a maximum of several ten to several hundred micrometers at a predetermined frequency is acquired, depending on the thickness and the structure of the electrode in the piezoelectric sheet.

Figure 15:
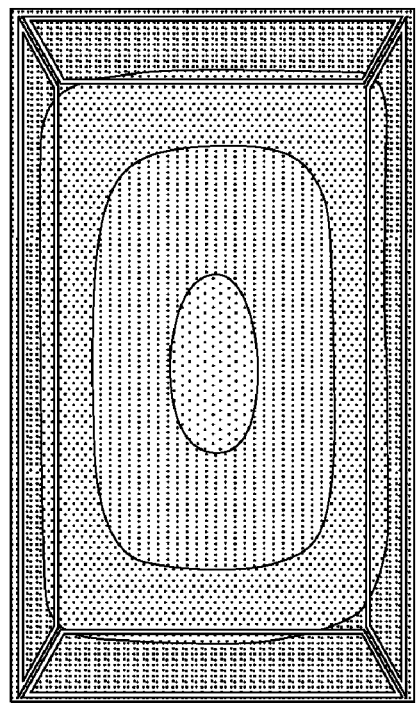
FIG. 15 is a plan view illustrating the displacement of the piezoelectric speaker having the electrode dimensional ratios a/A and b/B of 20% illustrated in FIG. 13.
Figure 16:
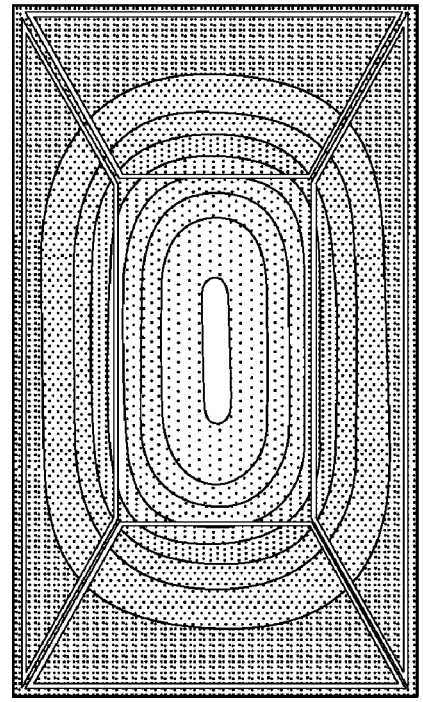
FIG. 16 is a plan view illustrating the displacement of the piezoelectric speaker having the electrode dimensional ratios a/A and b/B of 50% illustrated in FIG. 13.
Figure 17:
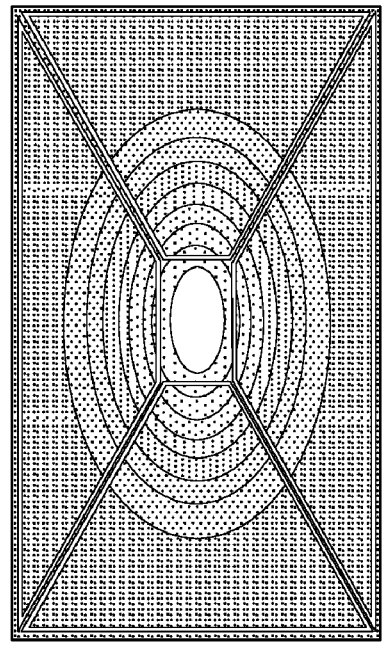
FIG. 17 is a plan view illustrating the displacement of the piezoelectric speaker having the electrode dimensional ratios a/A and b/B of 80% illustrated in FIG. 13.

FIGS. 15 to 17, corresponding to FIG. 11, illustrate the displacement when the aspect ratio of the electrode is changed. FIG. 15 illustrates the displacement in the case of a/A=20%, and b/B=20%, FIG. 16 illustrates the displacement in the case of a/A=50%, and b/B=50%, and FIG. 17 illustrates the displacement in the case of a/A=80%, and b/B=80%.

Comparing among FIGS. 15 to 17, it is found that the range of the displacement in a plane is great when the electrode aspect ratio is small. However, when the displacement amount is reduced, the electrode aspect ratio increases, the displacement amount increases, and the range of the displacement in a plane is reduced.

When sound is played, a great acoustic pressure is obtained, as the displacement range is great, and the displacement amount is great. Accordingly, the embodiment illustrated in FIG. 16, among those illustrated in FIGS. 15 to 17, and having a/A=50%, and b/B=50% is considered to be suitable for a speaker, and from the viewpoint of the relation with the displacement amount illustrated in FIG. 14, the range of 45 to 55% is particularly preferable for the speaker.

Figure 18:
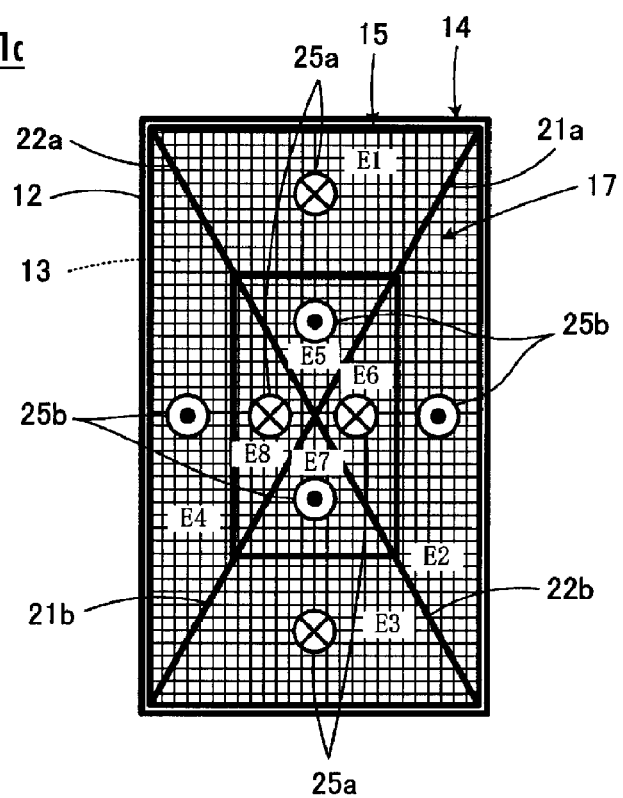
FIG. 18 is a plan view illustrating a piezoelectric speaker 11c according to a fourth embodiment of the present invention.

FIG. 18 is a view corresponding to FIG. 1 for describing a fourth embodiment of the present invention. In FIG. 18, the components corresponding to those illustrated in FIG. 1 are identified by the same symbols, and the repeated description will not be made.

A piezoelectric speaker 11c illustrated in FIG. 18 is characterized in that each of the first and second electrodes 16 to 19 further has fifth to eighth electrode portions E5 to E8 that are distributed in the central portion of the vibration region 15 as being isolated from the first to fourth electrode portions E1 to E4, and are divided by dividing lines 21a and 21b and dividing lines 22a and 22b, as illustrated for the second electrode 17 formed on the piezoelectric sheet 12.

Electric field vectors 25a and 25b are illustrated in FIG. 18. Electric field vector 25a is an electric field directing from the near side to the far side on the paper plane, while the electric field vector 25b is an electric field directing from the far side to the near side on the paper plane. As can be understood from the electric field vectors 25a and 25b, voltage is applied to the first to eighth electrode portions E1 to E8 in such a manner that vectors of electric field generated in the thickness direction of the piezoelectric sheets 12 and 13 direct in the opposite directions between the adjacent ones of the first to eighth sheet portions of the piezoelectric sheets 12 and 13 to which the voltage is respectively applied by the first to eighth electrode portions E1 to E8. In this embodiment also, the voltage is applied to the electrodes 16 to 19 in such a manner that the piezoelectric sheet 12 and the piezoelectric sheet 13, which are bonded to each other, direct in the opposite directions so as to achieve a bimorph vibration. For example, when the vectors in the stretching direction of the piezoelectric sheet 12 and the piezoelectric sheet 13 direct in the same direction, and the sheets are overlapped without inversing the vertical relationship of the front surface and the back surface during the stretching, the electric field vectors, each directing in the opposite directions, are applied to the piezoelectric sheet 12 and the piezoelectric sheet 13.

Figure 19:
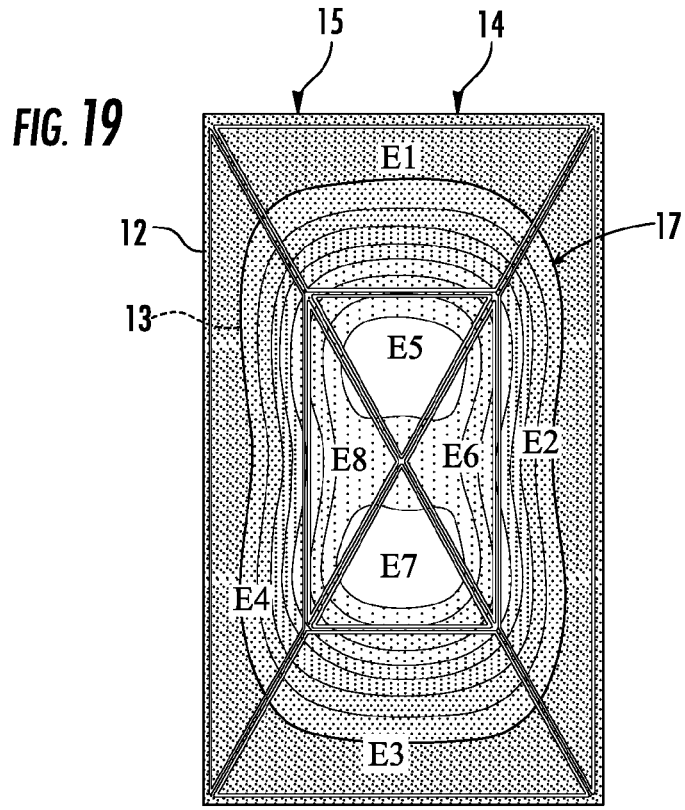
FIG. 19 is a plan view corresponding to FIG. 8 and illustrating the displacement of the piezoelectric speaker 11c illustrated in FIG. 18.

FIG. 19 is a view corresponding to FIG. 8 for the piezoelectric speaker 11c illustrated in FIG. 18. FIG. 19 illustrates the displacement in the case of a/A=50%, and b/B=50% illustrated in FIG. 13.

Figure 20:
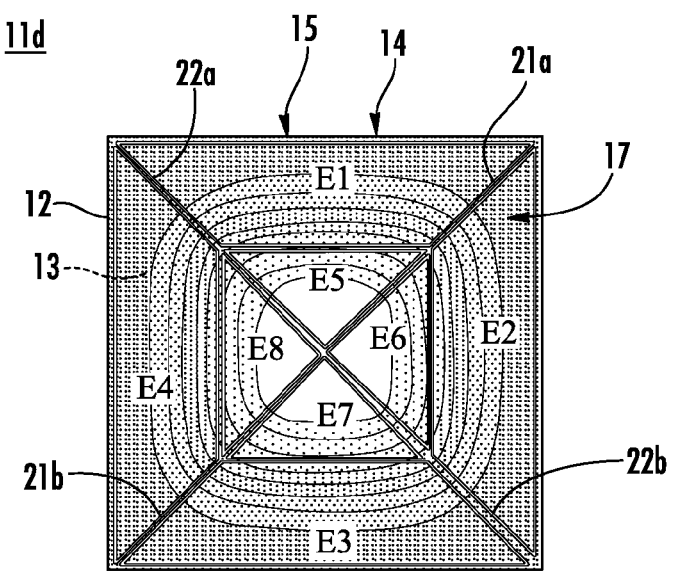
FIG. 20 is a plan view corresponding to FIG. 8 and illustrating a displacement of a piezoelectric speaker 11d according to a fifth embodiment of the present invention.

FIG. 20 is a view corresponding to FIG. 19 for describing a fifth embodiment of the present invention.

The piezoelectric speaker 11c illustrated in FIG. 19 has a rectangular outer shape, but a piezoelectric speaker 11d illustrated in FIG. 20 has a square outer shape. The other points of the piezoelectric speaker 11d are substantially the same as those of the piezoelectric speaker 11c.

Comparing FIGS. 19 and 20 and the above-mentioned FIGS. 8 and 11, it is found that the area of the maximum displacement region increases in the piezoelectric speakers 11c and 11d illustrated respectively in FIGS. 19 and 20. Therefore, sound is more efficiently generated according to the piezoelectric speakers 11c and 11d.

The electrodes 16 to 19 can be formed on the substantial whole region of the piezoelectric sheets 12 and 13 according to the piezoelectric speakers 11c and lid illustrated respectively in FIGS. 19 and 20, whereby a feeling of strangeness caused by a visual difference between the electrode formation portion and the electrode non-formation portion can be eased.

Figure 21:
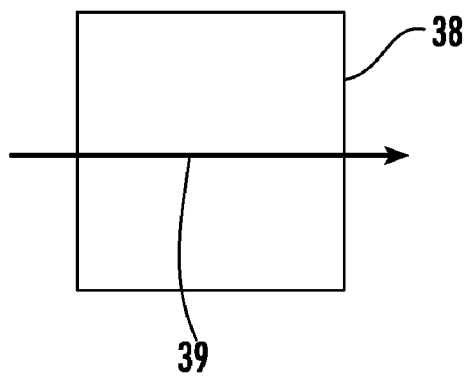
FIG. 21 is a plan view corresponding to FIG. 4, and illustrating a piezoelectric sheet 38 having a stretching axis 39 in a direction different from that in the piezoelectric sheet 8 in FIG. 4.
Figure 22:
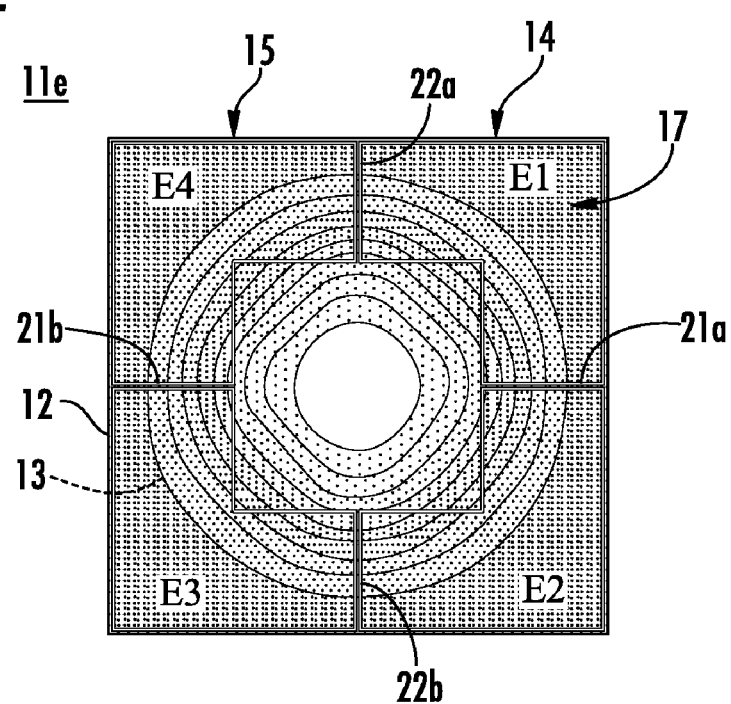
FIG. 22 is a plan view corresponding to FIG. 8 and illustrating a displacement of a piezoelectric speaker 11e according to a sixth embodiment of the present invention.
Figure 23:
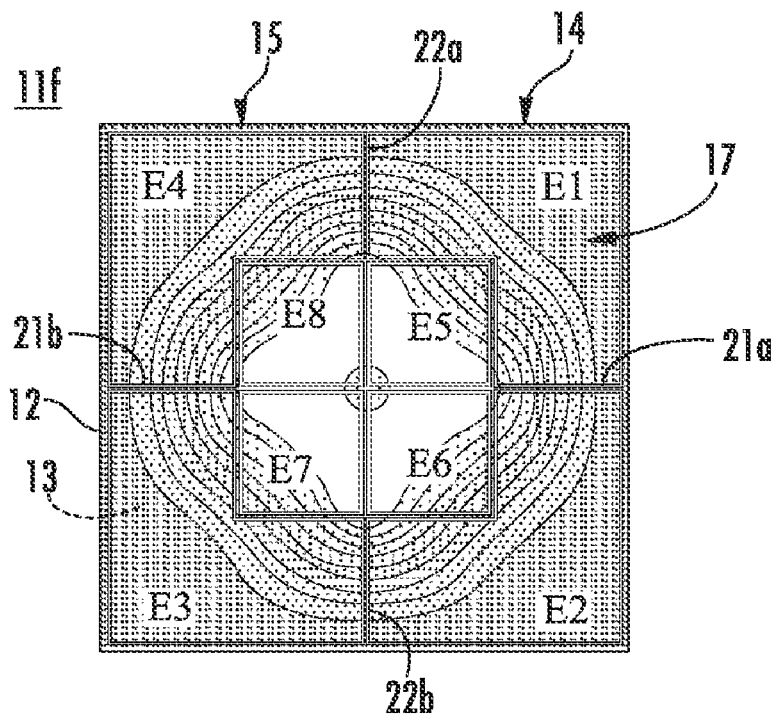
FIG. 23 is a plan view corresponding to FIG. 8 and illustrating a displacement of a piezoelectric speaker 11f according to a seventh embodiment of the present invention.
Figure 24:
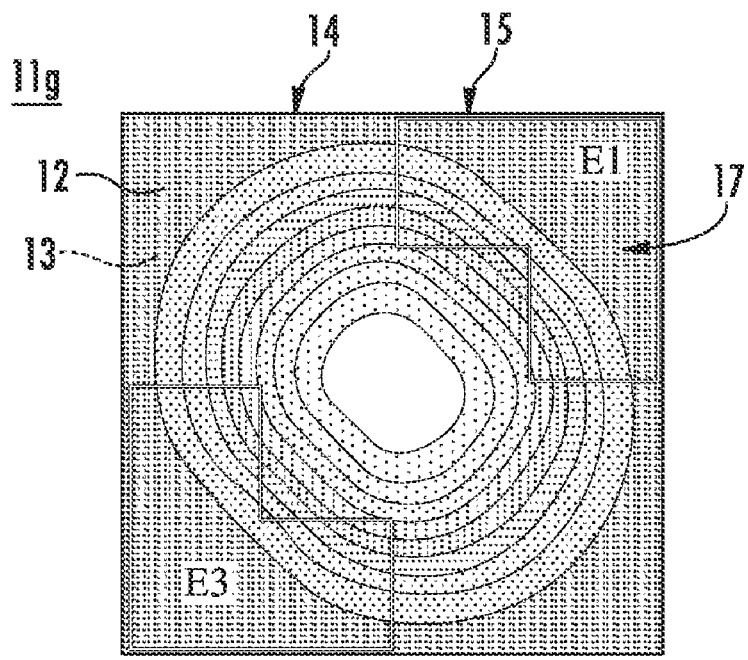
FIG. 24 is a plan view corresponding to FIG. 8 and illustrating a displacement of a piezoelectric speaker 11g according to an eighth embodiment of the present invention.

FIG. 21 is a view corresponding to FIG. 4, and illustrating a piezoelectric sheet 38 in which the direction of the stretching axis 39 is different from that of the piezoelectric sheet 8 illustrated in FIG. 4. Specifically, in the piezoelectric sheet 38, the stretching axis 39 extends parallel to one side of the piezoelectric sheet 38. The embodiment using the piezoelectric sheet 38 described above is illustrated in FIGS. 22 to 24. In FIGS. 22 to 24, the components corresponding to those illustrated in FIG. 8 or FIG. 20 are identified by the same symbols, and the repeated description will not be made.

In a piezoelectric speaker 11e in a sixth embodiment illustrated in FIG. 22, first to fourth electrode portions E1 to E4 have an L-shape, and are located at the corner portions of the piezoelectric sheets 12 and 13. In this embodiment also, the first to fourth electrode portions E1 to E4 are divided by the dividing lines 21a and 21b and the dividing lines 22a and 22b intersecting one another, wherein the dividing lines 21a and 21b have an angle of 0 degrees with respect to the stretching axis 39 (see FIG. 21), while the dividing lines 22a and 22b have an angle of 90 degrees with respect to the stretching axis 39.

A piezoelectric speaker 11f according to a seventh embodiment illustrated in FIG. 23 is characterized by further including fifth to eighth electrode portions E5 to E8, compared to the piezoelectric speaker 11e.

According to the piezoelectric speakers 11e and 11f illustrated in FIGS. 22 and 23, the displacement equal to or slightly greater than the displacement in the piezoelectric speakers 11 and 11d illustrated in FIGS. 8 and 20 can be obtained.

Compared to the piezoelectric speaker 11e illustrated in FIG. 22, a piezoelectric speaker 11g in an eighth embodiment illustrated in FIG. 24 is characterized in that the second and fourth electrode portions E2 and E4 are deleted. Specifically, it is characterized in that, when the outer peripheral portion is divided into four in order that the first to fourth portions are arranged in the circumferential direction in this order at the outer peripheral portion except for the central portion of the vibration region 15, the first and second electrodes 16 and 17 are made respectively of two electrode portions E1 and E3 located respectively on the first and third portions.

In this embodiment, in the two sheet portions of the piezoelectric sheets 12 and 13 to which the voltage is applied by the two electrode portions E1 and E3, the voltage is applied respectively to the two electrode portions E1 and E3 in such a manner that the electric field vectors generated in the thickness direction of the piezoelectric sheets 12 and 13 direct in the same direction.

According to the piezoelectric speaker 11g illustrated in FIG. 24, the displacement amount is reduced to about half the displacement in the piezoelectric speaker 11e illustrated in FIG. 22.

The piezoelectric speakers 11e to 11g illustrated in FIGS. 22 to 24 have the advantages described below, since they employ the piezoelectric sheet 38 having the stretching axis 39 with the direction illustrated in FIG. 21.

Specifically, in the case where the piezoelectric sheet 8 having the stretching axis 9 with the direction illustrated in FIG. 4 is used, when a rectangular piezoelectric sheet is cut out from a longitudinal mother sheet to which a stretching process is performed, it has to be cut out with the side thereof being oriented at an angle of 45 degrees with respect to the stretching axis, whereby relatively many unnecessary portions of the mother sheet are generated. On the other hand, when the piezoelectric sheet 38 illustrated in FIG. 21 is cut out from the mother sheet, it may be cut out with one side of the rectangular piezoelectric sheet 38 being oriented to be parallel to the stretching axis, with the result that the above-mentioned unnecessary portions can significantly be reduced.

Figure 25:
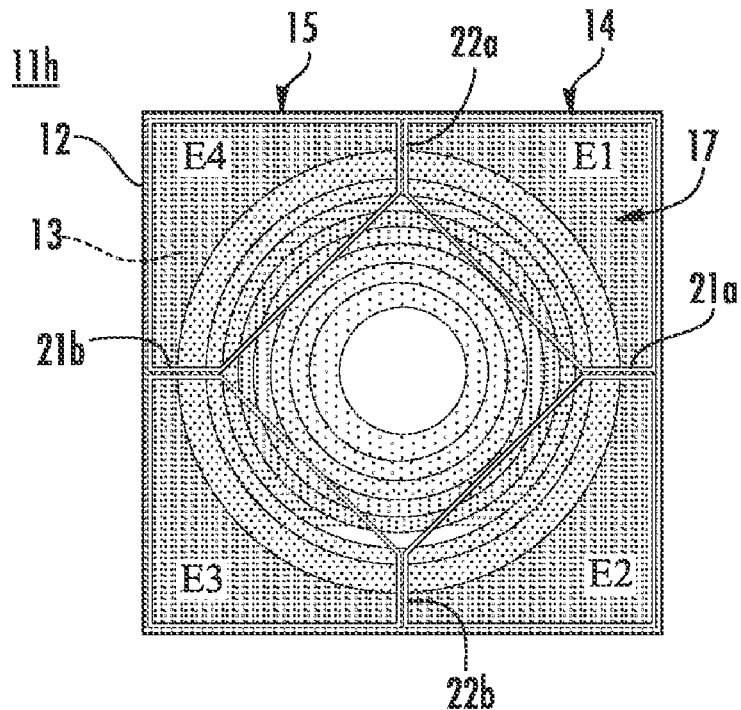
FIG. 25 is a plan view corresponding to FIG. 8 and illustrating a displacement of a piezoelectric speaker 11h according to a ninth embodiment of the present invention.
Figure 26:
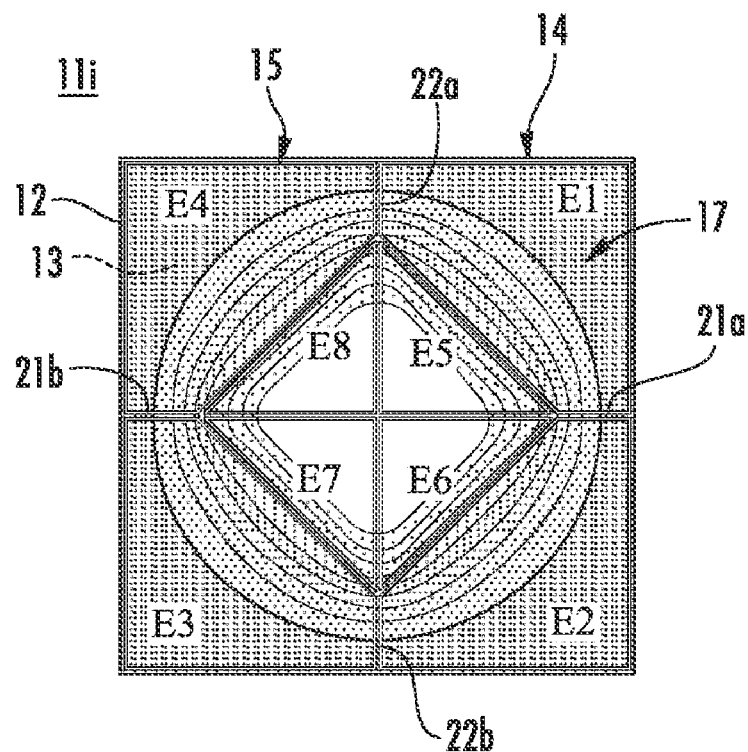
FIG. 26 is a plan view corresponding to FIG. 8 and illustrating a displacement of a piezoelectric speaker 11i according to a tenth embodiment of the present invention.

FIGS. 25 and 26 illustrate piezoelectric speakers 11h and 11i according to a ninth embodiment and a tenth embodiment, which are modifications of the piezoelectric speakers 11e and 11f illustrated in FIGS. 22 and 23.

The piezoelectric speakers 11h and 11i illustrated in FIGS. 25 and 26 are characterized in that the first to fourth electrode portions E1 to E4 have a pentagonal shape. In the piezoelectric speaker 11h illustrated in FIG. 25, the electrode non-formation portion at the center is rectangular. This electrode non-formation portion may be changed to be circular. Alternatively, it may be changed to have a polygonal shape such as a hexagonal shape or octagonal shape. In the piezoelectric speaker 11i illustrated in FIG. 26, the fifth to eighth electrode portions E5 to E8 have a triangular shape.

Figure 27:
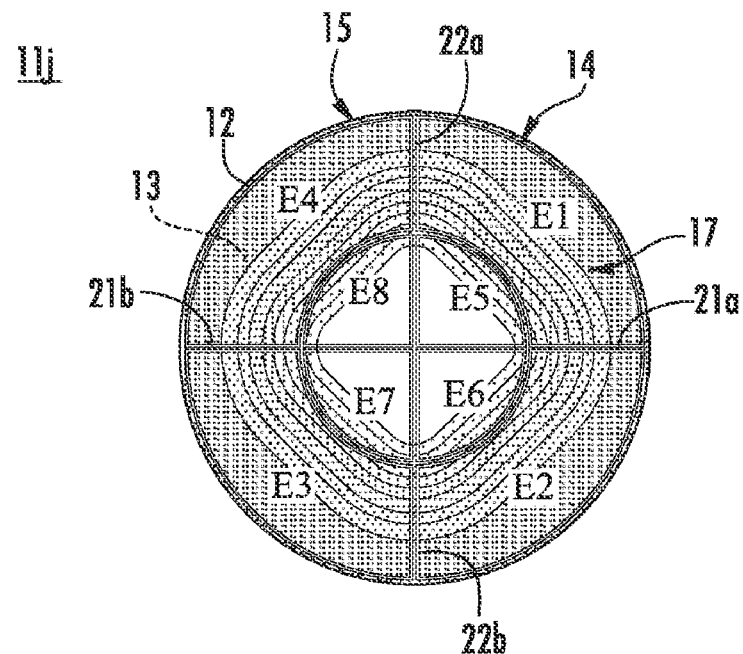
FIG. 27 is a plan view corresponding to FIG. 8 and illustrating a displacement of a piezoelectric speaker 11j according to an eleventh embodiment of the present invention.
Figure 28:
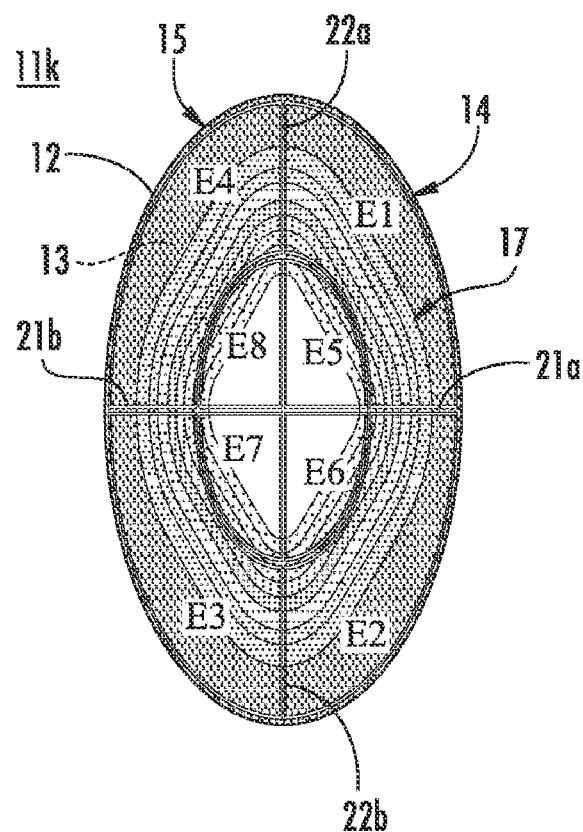
FIG. 28 is a plan view corresponding to FIG. 8 and illustrating a displacement of a piezoelectric speaker 11k according to a twelfth embodiment of the present invention.

FIGS. 27 and 28 illustrate piezoelectric speakers 11j and 11k according to an eleventh embodiment and a twelfth embodiment, which are another modifications of the piezoelectric speaker 11f illustrated in FIG. 23. In FIGS. 27 and 28, the components corresponding to those illustrated in FIG. 23 are identified by the same symbols, and the repeated description will not be made.

The piezoelectric speaker 11j illustrated in FIG. 27 has a circular shape, while the piezoelectric speaker 11k illustrated in FIG. 28 has an elliptic shape.

As can be understood from these embodiments, the piezoelectric speaker may have another shape, such as an oval shape or a polygonal shape.

Figure 29:
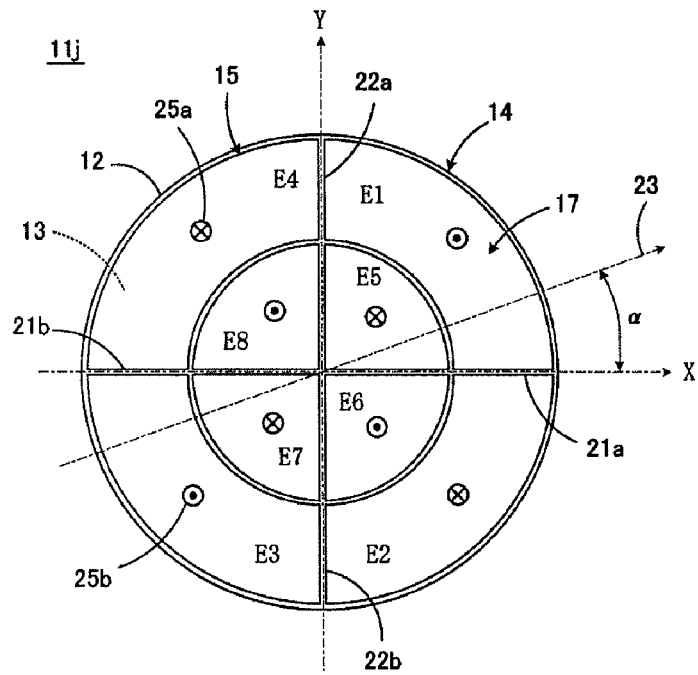
FIG. 29 is a view obtained by rewriting the piezoelectric speaker 11j illustrated in FIG. 27 for describing an angle α between a dividing line and the stretching axis.

Next, the relationship between the direction of each of the dividing lines, which divide the electrode into a plurality of electrode portions, and the direction of the stretching axis will be examined with reference to FIG. 29. FIG. 29 is the view obtained by rewriting the piezoelectric speaker 11j illustrated in FIG. 27 for the description. In FIG. 29, the components corresponding to those illustrated in FIG. 27 are identified by the same symbols. FIG. 29 also illustrates the electric field vectors corresponding respectively to the electric field vectors 25a and 25b illustrated in FIG. 18.

Figure 30:
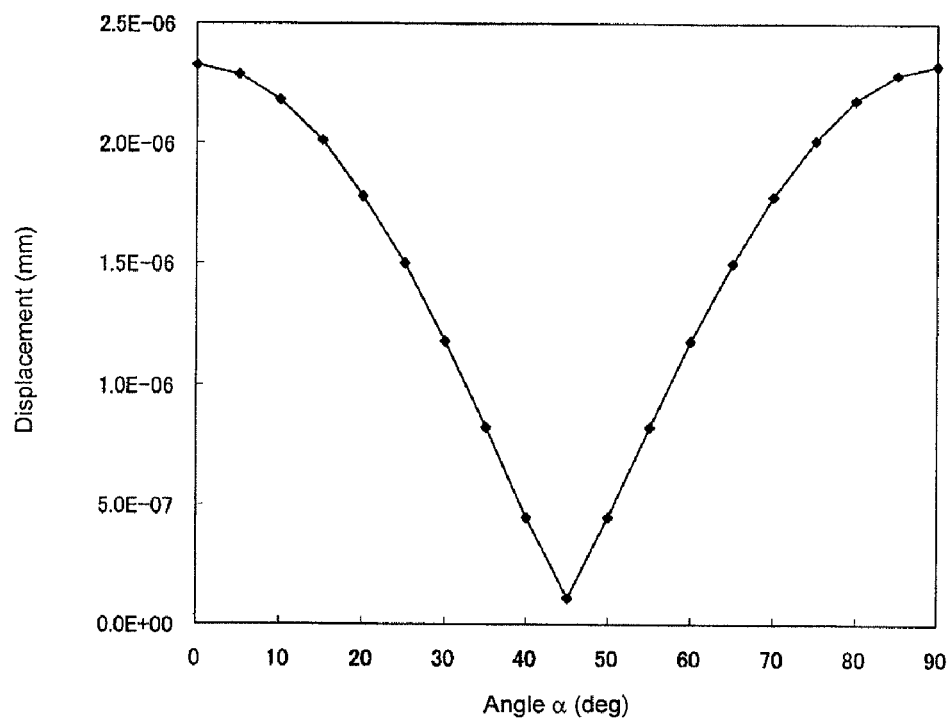
FIG. 30 is a view illustrating the relationship between the angle α and the displacement for the piezoelectric speaker 11j illustrated in FIG. 29.

The dividing lines 21a and 21b of the dividing lines for dividing each of the electrodes 16 to 18 into the first to eighth electrode portions E1 to E8 are along the X-axis, while the dividing lines 22a and 22b are along the Y-axis. In this case, the relationship between the angle α made by the stretching axis 23 and the X-axis and the absolute value of the displacement amount is illustrated in FIG. 30. The displacement amount is obtained by a static analysis in the finite element method, and the calculation is performed with the radius of the piezoelectric sheets 12 and 13 being set to be 25 mm, the thickness thereof being set to be 0.075 mm, and the space between the electrode portions E1 to E8 being set to be 0.5 mm.

As understood from FIG. 30, the displacement becomes the maximum when α is 0 degrees, and the displacement again increases with 45 degrees being defined as a minimum singular point, and then, becomes the same value as 0 degrees at 90 degrees. It is found from this that the most idealistic displacement can be attained, if the either one of the dividing lines 21a and 21b and the dividing lines 22a and 22b extends parallel to the stretching axis 23 (makes 0 degrees), and the other one extends at a right angle (makes 90 degrees).

Figure 31:
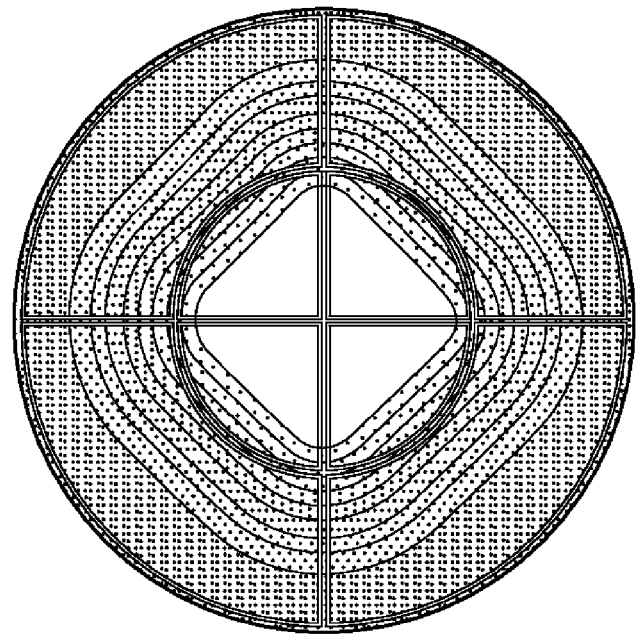
FIG. 31 is a plan view corresponding to FIG. 8 and illustrating the displacement of the piezoelectric speaker in which the angle α illustrated in FIG. 29 is set to 30 degrees.
Figure 32:
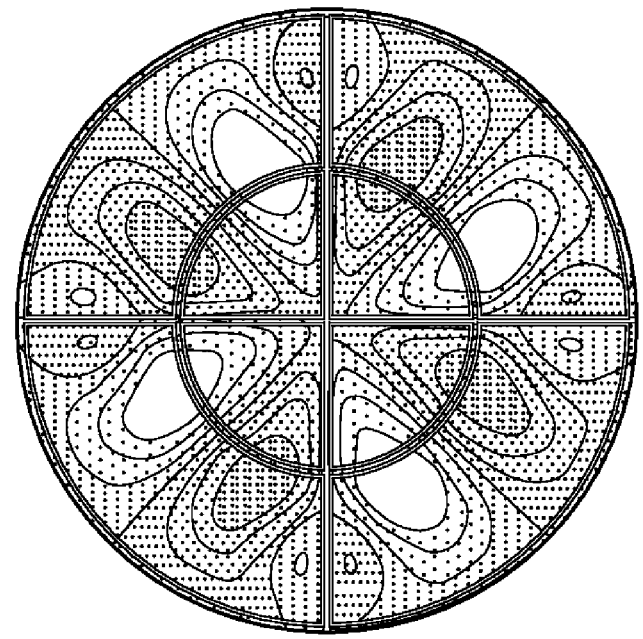
FIG. 32 is a plan view corresponding to FIG. 8 and illustrating the displacement of the piezoelectric speaker in which the angle α illustrated in FIG. 29 is set to 45 degrees.

FIG. 31 illustrates the displacement when α is 30 degrees, but the displacement mode itself substantially keeps the ideal mode. The displacement mode close to the ideal mode is maintained within the range of about 0 degrees≦α<40 degrees, and 50 degrees<α≦90 degrees, and as α approaches 45 degrees, the mode is gradually altered. When α is 45 degrees, the displacement illustrated in FIG. 32 is attained, wherein a convex portion and a concave portion are mixed therein, which is unsuitable for forming acoustic wave. Since the displacement amount is also small, the acoustic wave is hardly formed.

FIG. 30 suggests that the acoustic wave can be formed even within the range slightly deviated from the ideal state (0 degrees, 90 degrees). It is considered that the state very close to the ideal state can be obtained within the range of 0 to 10 degrees and 80 to 90 degrees.

The preferable range for α can almost be maintained even if the shape of the piezoelectric sheet provided to the piezoelectric speaker is changed to the shape other than a circle, such as a rectangle, but according to the change in the shape, the α can suitably be adjusted in order to obtain as great displacement as possible.

Figure 33:
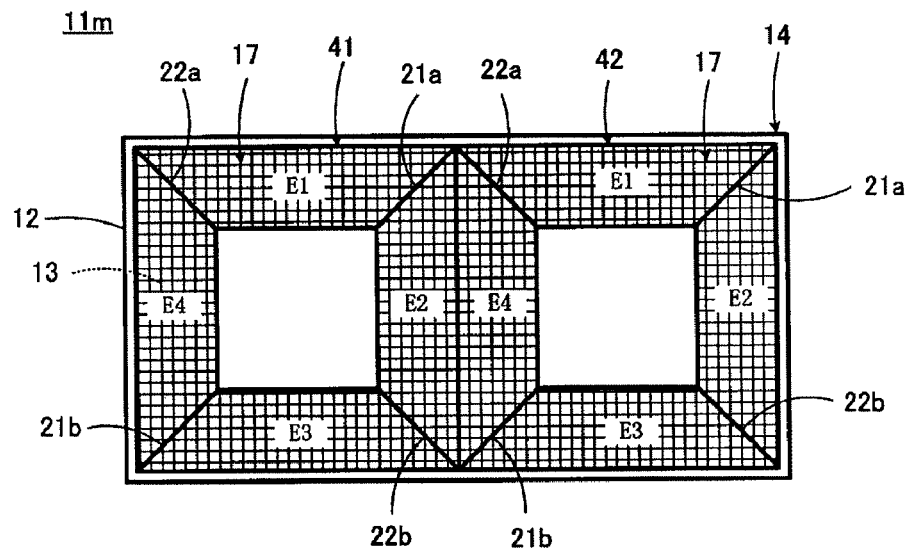
FIG. 33 is a plan view illustrating a piezoelectric speaker 11m according to a thirteenth embodiment of the present invention.
Figure 34:
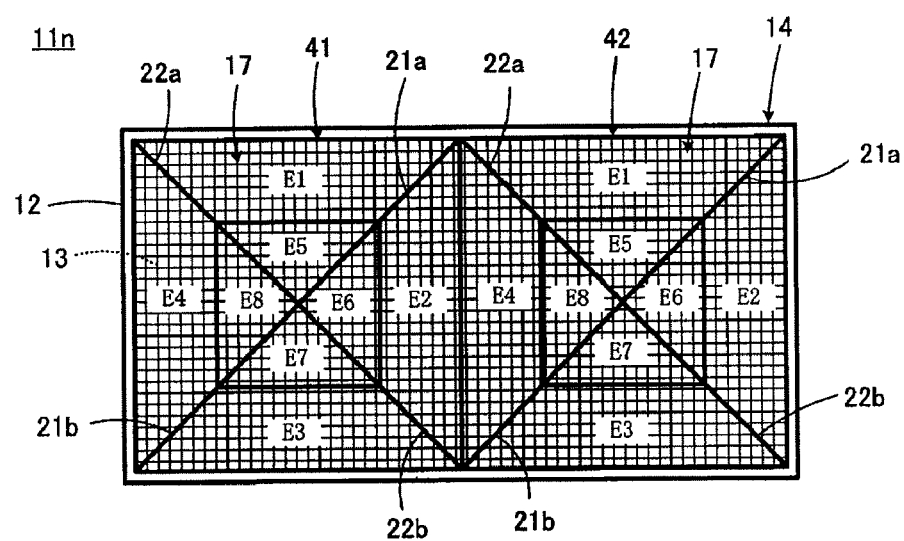
FIG. 34 is a plan view illustrating a piezoelectric speaker 11n according to a fourteenth embodiment of the present invention.

FIGS. 33 and 34 are views corresponding to FIG. 1 or FIG. 18 for describing a thirteenth embodiment and a fourteenth embodiment according to the present invention. In FIGS. 33 and 34, the components corresponding to those illustrated in FIG. 1 or FIG. 18 are identified by the same symbols, and the repeated description will not be made.

Piezoelectric speakers 11m and 11n illustrated respectively in FIGS. 33 and 34 are characterized in that two vibration regions 41 and 42, which are distributed in two portions, are provided on common piezoelectric sheets 12 and 13. In these embodiments, the vibration regions 41 and 42 are arranged side by side.

In the piezoelectric speaker 11m illustrated in FIG. 33, the two vibration regions 41 and 42 respectively have the configuration of the piezoelectric speaker 11 illustrated in FIG. 1. On the other hand, in the piezoelectric speaker 11n illustrated in FIG. 34, the two vibration regions 41 and 42 respectively have the same shape and configuration as those in the piezoelectric speaker 11d illustrated in FIG. 20, and have the same configuration as that of the piezoelectric speaker 11c illustrated in FIG. 18, although the shape is different.

These piezoelectric speakers 11m and 11n are fixed at only four sides corresponding to the outer periphery thereof, and the borderline between the vibration region 41 and the vibration region 42, for example, is not mechanically fixed. A rib or the like may be provided at the borderline to mechanically fix the same.

Figure 35:
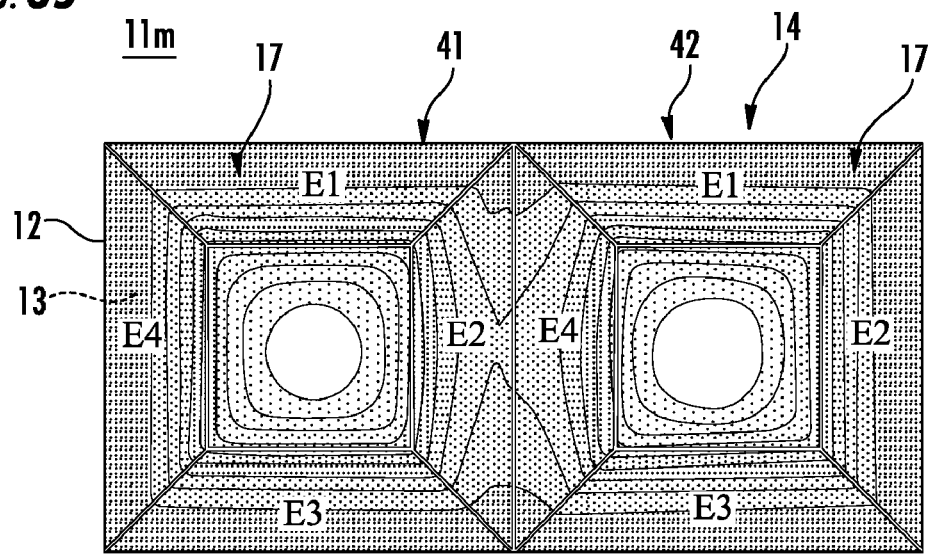
FIG. 35 is a plan view corresponding to FIG. 8 and illustrating the displacement of the piezoelectric speaker 11m illustrated in FIG. 33.
Figure 36:
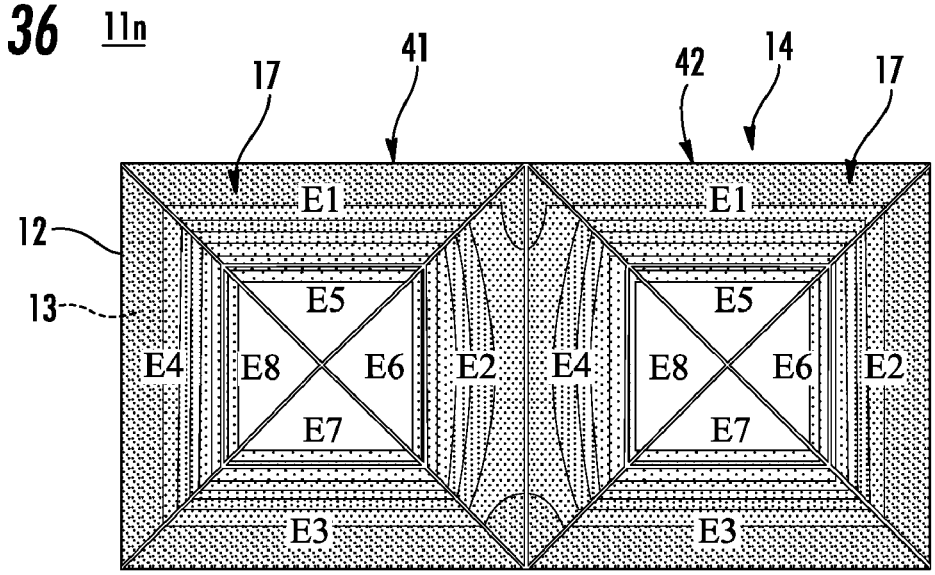
FIG. 36 is a plan view corresponding to FIG. 8 and illustrating the displacement of the piezoelectric speaker 11n illustrated in FIG. 34.

FIGS. 35 and 36 illustrate the displacement of the piezoelectric speakers 11m and 11n illustrated in FIGS. 33 and 34. It is understood from FIGS. 35 and 36 that almost independent displacement is produced in each of the two vibration regions 41 and 42 even in the piezoelectric speakers 11m and 11n. Accordingly, when another signal is inputted to each of the vibration regions 41 and 42, the vibration of each signal is independently produced in each of the vibration regions 41 and 42.

From the above, the piezoelectric speakers 11m and 11n can be functioned as a stereo speaker. When the piezoelectric speakers 11m and 11n are made transparent, and arranged on a display surface of a cellular phone, a stereo reproduction is possible without providing a mechanical fixed region at the center. Specifically, a stereo speaker can be provided without producing a feeling of visual strangeness due to the mechanical fixed region.

The piezoelectric speakers 11m and 11n have two vibration regions 41 and 42, and when a great number of vibration regions described above are linearly formed, a speaker array can be configured. The speaker array described above can be formed into a speaker having directivity in a predetermined direction by adjusting the phase of the vibration reproduced from each vibration region in a predetermined amount.

Figure 37:
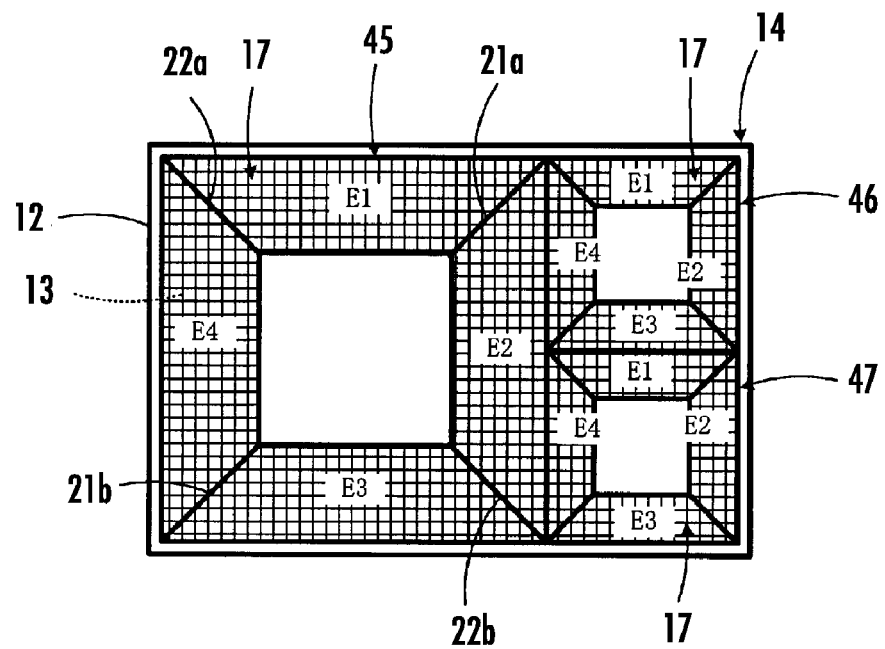
FIG. 37 is a plan view illustrating a piezoelectric speaker 11p according to a fifteenth embodiment of the present invention.

FIG. 37 is a view corresponding to FIG. 1 for describing a fifteenth embodiment of the present invention. In FIG. 37, the components corresponding to those illustrated in FIG. 1 are identified by the same symbols, and the repeated description will not be made.

In general, a frequency characteristic of a speaker greatly depends on a size of a speaker. When the speaker is large, a resonance point is present in a low-pitched sound range, and when the speaker is small, the resonance point gradually increases from a middle-pitched sound range to a high-pitched sound range. For example, in the case of the piezoelectric speaker 11 illustrated in FIG. 1, the basic resonance mode at the lowest point is about 219 Hz by the resonance analysis simulation in the finite element method in the square having one side of 50 mm, while the basic resonance mode at the lowest point is about 640 Hz in the square having one side of 25 mm. Although air is not considered in this simulation, it is found that the resonance frequency actually becomes two to four times the above-mentioned frequency because of the air, the thickness of the electrode, or the type of the electrode.

In a piezoelectric speaker 11p illustrated in FIG. 37, three vibration regions 45 to 47 are formed on the common piezoelectric sheets 12 and 13, and among them, the size of the vibration region 45 is the greatest, and the sizes of the vibration regions 46 and 47 are smaller than the size of the vibration region 45 and are the same as each other. By virtue of this, the vibration region 45 can be functioned as a squawker portion (middle-pitched sound range) or a woofer portion (low-pitched sound range), and the vibration regions 46 and 47 can be functioned as a tweeter portion (high-pitched sound range) or a squawker portion (middle-pitched sound range), whereby the piezoelectric speaker 11p can be made into a two-way speaker.

Figure 38:
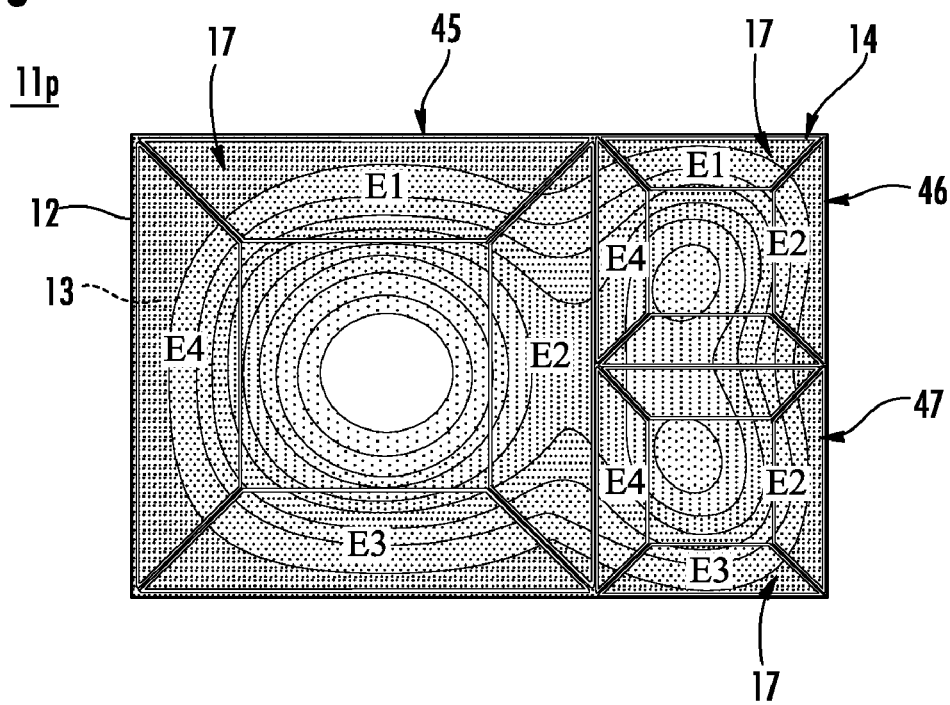
FIG. 38 is a plan view corresponding to FIG. 8 and illustrating the displacement of the piezoelectric speaker 11p illustrated in FIG. 37.

FIG. 38 illustrates the displacement of the piezoelectric speaker 11p illustrated in FIG. 37. It is understood from FIG. 38 that substantially independent vibration is generated from each of three vibration regions 45 to 47.

A speaker having an optional frequency characteristic can be configured by adjusting the size of the speaker, the type of the electrode, and the thickness of the electrode depending on the sound range that is intended to be reproduced. Therefore, the above-mentioned adjustment may be performed to the vibration regions 45 to 47, according to need.

Figure 39:
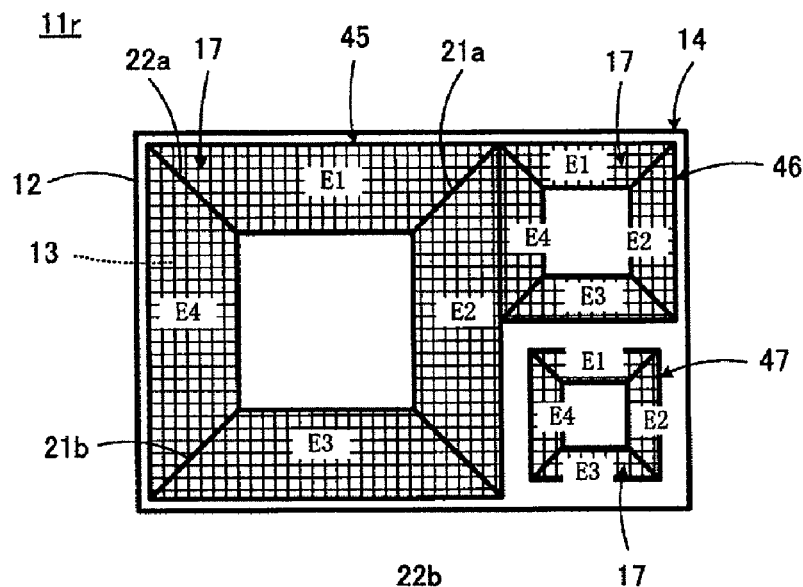
FIG. 39 is a plan view illustrating a piezoelectric speaker 11r according to a sixteenth embodiment of the present invention.

FIG. 39 is a view corresponding to FIG. 37 for describing a sixteenth embodiment of the present invention. In FIG. 39, the components corresponding to those illustrated in FIG. 37 are identified by the same symbols, and the repeated description will not be made.

A piezoelectric speaker 11r illustrated in FIG. 39 composes a three-way speaker, wherein the sizes of the vibration region 45, the vibration region 46, and the vibration region 47 are reduced in this order. Therefore, a woofer portion (low-pitched sound range) is provided by the vibration region 45, a squawker portion (middle-pitched sound range) is provided by the vibration region 46, and a tweeter portion (high-pitched sound range) is provided by the vibration region 47.

In the piezoelectric speakers 11m, 11n, 11p, and 11r described with reference to FIGS. 33 to 39, the vibration regions 41 and 42 or the vibration regions 45 to 47 are not necessarily square, and the ratio of a/A and/or b/B illustrated in FIG. 13 may be changed for every electrode portions E1 to E4. Each of the vibration regions 41 and 42 and the vibration regions 45 to 47 may be provided with the first to eighth electrode portions E1 to E8 as in the piezoelectric speaker 11c illustrated in FIG. 18, for example.

Figure 40:
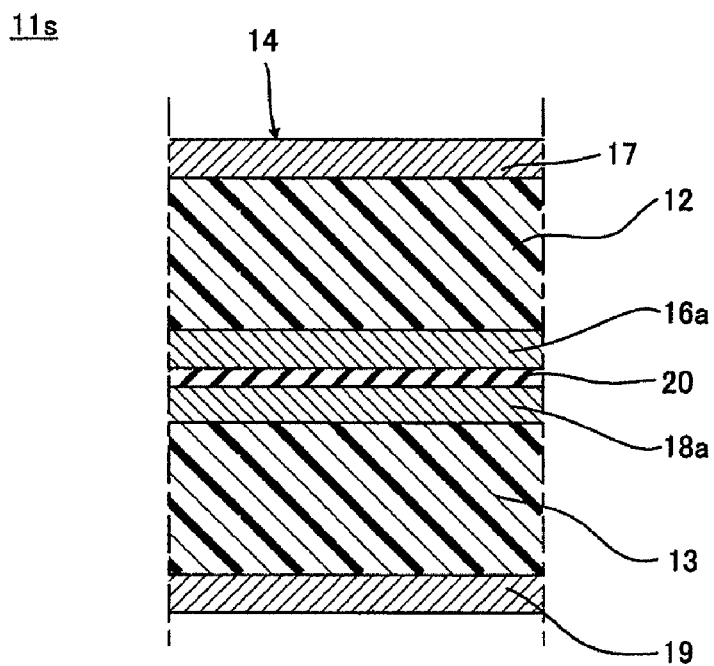
FIG. 40 is a view corresponding to FIG. 2 and illustrating a piezoelectric speaker 11s according to a seventeenth embodiment of the present invention.

FIG. 40 is a view corresponding to FIG. 2 and illustrating a piezoelectric speaker 11s according to a seventeenth embodiment of the present invention. In FIG. 40, the components corresponding to those illustrated in FIG. 2 are identified by the same symbols, and the repeated description will not be made.

In the above-mentioned piezoelectric speaker 11 according to the first embodiment illustrated in FIG. 2, the first and second electrodes 16 and 17 on piezoelectric sheet 12 are formed to have the same pattern, and similarly, the first and second electrodes 18 and 19 on the piezoelectric sheet 13 are formed to have the same pattern. Each of the electrodes 16 to 19 is a divided electrode including the first to fourth electrode portions E1 to E4 divided by the plurality of dividing lines 21a, 21b, 22a, and 22b extending in the radiation direction.

On the other hand, the piezoelectric speaker 11s according to the seventeenth embodiment is characterized in that only the second electrodes 17 and 19 are the divided electrodes made of the first to fourth electrode portions E1 to E4, while the first electrodes 16a and 18a are uniform common electrodes commonly facing the plurality of electrode portions E1 to E4 forming the divided electrodes.

In order to vibrate the bimorph structure composing the piezoelectric speaker 11s described above, voltage is applied between the first and second electrodes 16a and 17 for the piezoelectric sheet 12, while voltage is applied between the first and second electrodes 18a and 19 for the piezoelectric sheet 13, wherein an alternating-current signal for this is supplied only to the second electrodes 17 and 19 that are the divided electrodes, and it does not need to be supplied to the first electrodes 16a and 18a that are the common electrodes. It is preferable that the first electrodes 16a and 18a that are the common electrodes have a ground potential. With this configuration, a conductive pattern (not illustrated) that should be connected to a signal supplying line can be simplified. This will be described in more detail below with reference to FIGS. 41 to 43.

Figure 41:
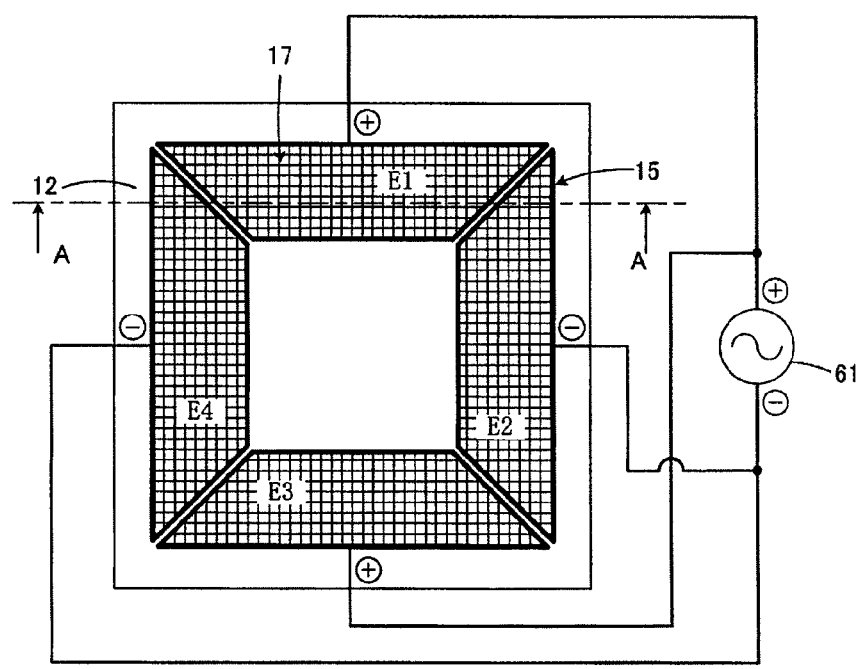
FIG. 41 is a plan view of the piezoelectric sheet 12, wherein a circuit structure for supplying an alternating-current signal to the piezoelectric sheet 12 of the piezoelectric speaker 11s illustrated in FIG. 40 is graphically illustrated.
Figure 42:
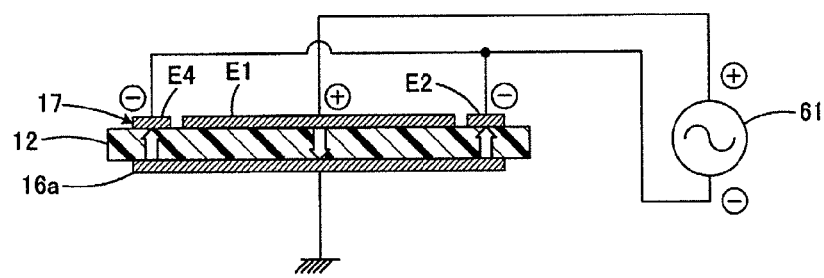
FIG. 42 is a sectional view taken along line A-A in FIG. 41, wherein a circuit structure for supplying an alternating-current signal to the piezoelectric sheet 12 of the piezoelectric speaker 11s is graphically illustrated.
Figure 43:
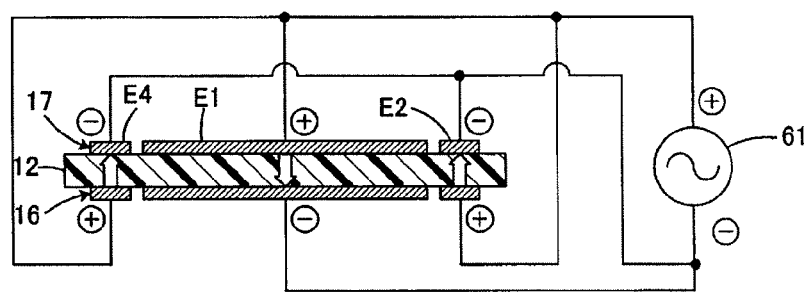
FIG. 43 is a view corresponding to FIG. 42, wherein a circuit structure for supplying an alternating-current signal to the piezoelectric sheet 12 of the piezoelectric speaker 11 according to the first embodiment is graphically illustrated for comparison.

FIGS. 41 and 42 are views graphically illustrating a circuit structure for supplying the alternating-current signal to the piezoelectric sheet 12 of the piezoelectric speaker 11s. In FIG. 41, the piezoelectric sheet 12 is illustrated in a plan view, while in FIG. 42, the piezoelectric sheet 12 is illustrated in a sectional view taken along line A-A in FIG. 41. FIG. 43 is a view corresponding to FIG. 42, wherein a circuit structure for supplying an alternating-current signal to the piezoelectric sheet 12 of the piezoelectric speaker 11 according to the first embodiment is graphically illustrated for comparison.

In FIGS. 41 to 43, "+" and "−" represent a polarity of a supply signal at a certain moment. In FIGS. 42 and 43, an arrow represents the electric field vector.

As illustrated in FIG. 43, in the piezoelectric sheet 12 in the piezoelectric speaker 11 according to the first embodiment, the first and second electrodes 16 and 17 are formed as the divided electrodes, so that power supplying lines for the electrodes 16 and 17 from an alternating-current signal supplying source 61 are relatively complicated.

On the other hand, in the piezoelectric sheet 12 provided to the piezoelectric speaker 11s according to the seventeenth embodiment, only the second electrode 17 is the divided electrode, and the first electrode 16a is set to be the common electrode, whereby it is unnecessary to supply power to the first electrode 16a from the alternating-current signal supplying source 61 as illustrated in FIG. 42, with the result that the power supplying lines are simplified compared to those illustrated in FIG. 43. Although it is optional whether the first electrode 16a is set to have a ground potential or not, it is preferably connected to the ground as illustrated in FIG. 42, considering the influence of noise.

As understood from the comparison between FIGS. 42 and 43, the directions of the electric field vectors generated in the piezoelectric sheet 12 are the same. However, the magnitude of the electric field in FIG. 42 is the half that in FIG. 43, so that the supplied voltage has to be doubled in order to obtain the equivalent displacement amount.

When the instantaneous potential becomes as illustrated in FIG. 42, the charges in the first electrode 16a, which is the common electrode, move according to the potential of the second electrode 17 serving as the opposing divided electrode. Specifically, the minus charges move to the portion opposite to the electrode having the plus potential, while the plus charges remain on the portion opposite to the minus potential, from which the electric field is formed. This phenomenon is the same as that generated in the case of a serial connection of a capacitor.

The above description is for the piezoelectric sheet 12 in the piezoelectric speaker 11s, but the same is true for the piezoelectric sheet 13.

The first electrode 16a and the first electrode 18a in the piezoelectric speaker 11s may be isolated from each other by the bonding layer 20, or may be short-circuited.

Although in the seventeenth embodiment, the first electrodes 16a and 18a are set to be the common electrode, and the second electrodes 17 and 19 are set to be the divided electrode in the piezoelectric speaker 11s, which one is set to be the common electrode and which one is set to be the divided electrode may appropriately be determined according to the desired design.

It is preferable that the first electrodes 16a and 18a, which are the common electrodes, completely oppose to the second electrodes 17 and 19, which are the divided electrodes, on the whole region, but there may be the case in which a part thereof is lost because of the restriction in the formation of the electrode. The change may appropriately be made within the range in which the desired operation can be attained.

As is understood from the formation state of the first electrode 16a illustrated in FIG. 42, the first electrode 16a serving as the common electrode is not formed all over the main surface of the piezoelectric sheet 12, but the common electrode described above may be formed all over the main surface of the piezoelectric sheet.

As is analogized from the circuit structure illustrated in FIG. 42, even when both of the first and second electrodes 16 and 17 are the divided electrodes as in the structure illustrated in FIG. 43, the first electrode is externally connected in order that the plurality of electrode portions constituting the first electrode 16 have the same potential, and this may be the ground potential, for example, when the piezoelectric speaker is driven.

In the seventeenth embodiment, the second electrode 17 serving as the divided electrode has the first to fourth electrode portions E1 to E4 as illustrated in FIG. 41, but the structure having the common electrode can be applied to a speaker in which the second electrode 17 has the first to eighth electrode portions E1 to E8 like the piezoelectric speaker 11c illustrated in FIG. 18, for example.

In the case where the second electrode 17 is the divided electrode including two electrode portions E1 and E3 located respectively on the first and third portions, when the outer periphery is divided into four in such a manner that the first to fourth portions are arranged in the circumferential direction in this order on the outer periphery except for the central portion of the vibration region 15, like the piezoelectric speaker 11g illustrated in FIG. 24, an embodiment is possible wherein the first electrode 16 opposite to the second electrode 17 is set to be the common electrode.

Describing a modification of the seventeenth embodiment with reference to FIG. 40, the structure in which one of the first electrodes 16a and 18a, e.g., the electrode 18a, is eliminated is possible. In this case, the electric field vectors are produced by the electrodes 16a and 19 on the piezoelectric sheet 13. The intensity of the electric field applied to the piezoelectric sheet 13 is slightly lowered, compared to the intensity of the electric field applied to the piezoelectric sheet 12, by the amount corresponding to the sandwiched bonding layer 20. However, the process required to form the electrode 18a can be skipped, whereby cost can remarkably be reduced, and further, since the electrode 18a is not present, the transparency can be enhanced.

Figure 44:
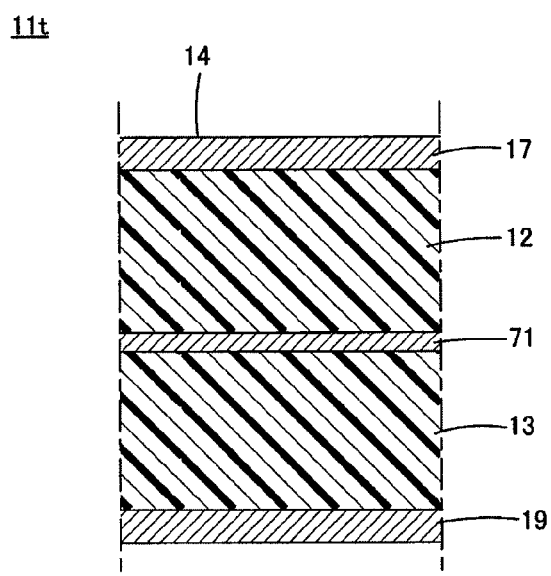
FIG. 44 is a view corresponding to FIG. 2 and illustrating a piezoelectric speaker 11t according to an eighteenth embodiment of the present invention.

FIG. 44 is a view corresponding to FIG. 2 and illustrating a piezoelectric speaker 11t according to an eighteenth embodiment of the present invention. In FIG. 44, the components corresponding to those illustrated in FIG. 2 are identified by the same symbols, and the repeated description will not be made.

The piezoelectric speaker 11t illustrated in FIG. 44 is different from the piezoelectric speaker 11 illustrated in FIG. 2 in that the piezoelectric speaker 11t does not have the electrodes 16 and 18 from the viewpoint of the structure. The component corresponding to the bonding layer 20 in FIG. 2 is made of a conductive adhesive agent, and constitutes a first electrode 71 serving as the first electrodes 16 and 18 in FIG. 2. The second electrodes 17 and 19 are the divided electrodes including the first to fourth electrode portions E1 to E4 like the second electrode 17 illustrated in FIG. 1, but the first electrode 71 is the common electrode. The circuit structure substantially same as the circuit structure illustrated in FIG. 42 is applicable to the circuit structure for supplying an alternating-current signal for applying the desired electric field vectors to the piezoelectric sheets 12 and 13.

According to the eighteenth embodiment described above, the process for forming the electrodes 16 and 18 illustrated in FIG. 2 can be skipped, so that the cost can remarkably be reduced. Since the electrodes 16 and 18 illustrated in FIG. 2 are not present, a light transmittance can be increased, and the transparency can be enhanced. Further, the bimorph structure can be simplified, and the risk of the peel of the bonding layer or the peel of the electrode can be reduced.

In the above-mentioned eighteenth embodiment, the second electrodes 17 and 19 that are the divided electrodes include the first to fourth electrode portions E1 to E4 like the second electrode 17 illustrated in FIG. 1, but instead of this, they may include the first to eighth electrode portions E1 to E8 like the second electrode 17 illustrated in FIG. 18, for example.

Figure 45:
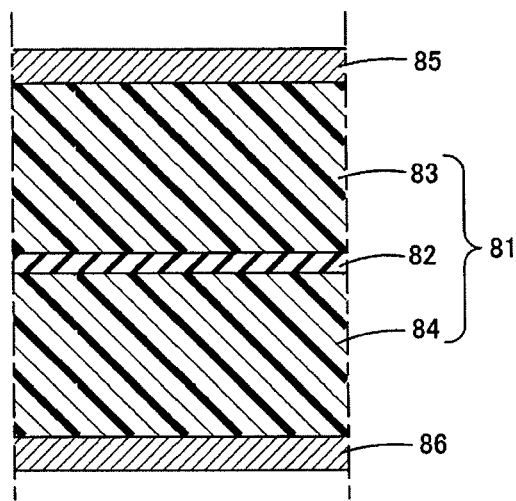
FIG. 45 is a view corresponding to FIG. 2 and illustrating a piezoelectric speaker 11u according to a nineteenth embodiment of the present invention.

FIG. 45 is a view corresponding to FIG. 2 and illustrating a piezoelectric speaker 11u according to a nineteenth embodiment of the present invention. Although the piezoelectric speaker 11u illustrated in FIG. 45 seems to be different from the piezoelectric speaker illustrated in FIG. 2 only in that the piezoelectric speaker 11u does not have the first electrodes 16 and 18 from the viewpoint of the structure, the structure for attaining the bimorph structure is basically different.

In the piezoelectric speaker illustrated in FIG. 45, a piezoelectric sheet 81 has a laminated structure having first and second piezoelectric sheet layers 83 and 84 bonded to each other through a bonding layer 82. Here, a stretching axis of the first piezoelectric sheet layer 83 and a stretching axis of the second piezoelectric sheet 84 are oriented in the different direction. As for the directions of the stretching axes, it is preferable that the stretching axis of the first piezoelectric sheet layer 83 and the stretching axis of the second piezoelectric sheet layer 84 cross each other with an angle of 90 degrees. With this, the maximum displacement can be obtained on the piezoelectric sheet 81. The stretched polymer sheet has a property that it is easy to be torn along the stretching axis. However, when the sheets are bonded in such a manner that the respective stretching axes of the first and second piezoelectric sheet layers 83 and 84 cross each other with an angle of 90 degrees, the ease of tear described above can be avoided, whereby a high strength can be obtained.

In this embodiment, the first and second electrodes 85 and 86 are formed respectively on the opposing first and second main surfaces of the piezoelectric sheet 81 having the laminated structure. In this embodiment, in particular, the first and second electrodes 85 and 86 are set to be the divided electrodes including the first to fourth electrode portions E1 to E4 like the second electrode 17 illustrated in FIG. 1.

Figure 46:
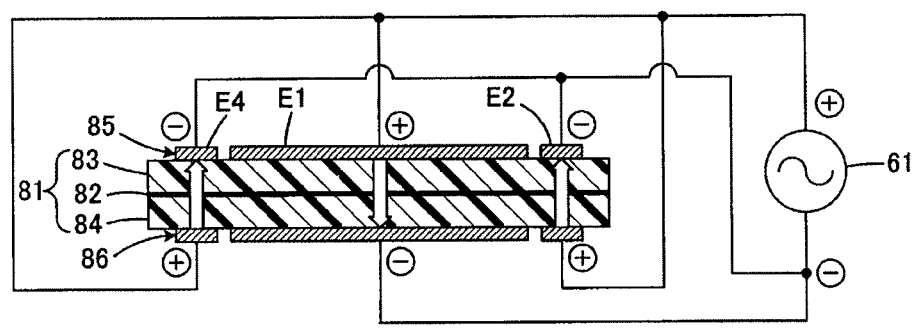
FIG. 46 is a view graphically illustrating a circuit structure for supplying an alternating-current signal to the piezoelectric speaker 11u illustrated in FIG. 45.

FIG. 46 graphically illustrates the circuit structure for supplying an alternating-current signal to the piezoelectric speaker flu described above. FIG. 46 illustrates the polarity of the supplied power at a certain moment from the alternating-current signal supplying source 61, and the electric field vectors generated in the piezoelectric sheet 81 with arrows, as in FIG. 43.

Figure 47:
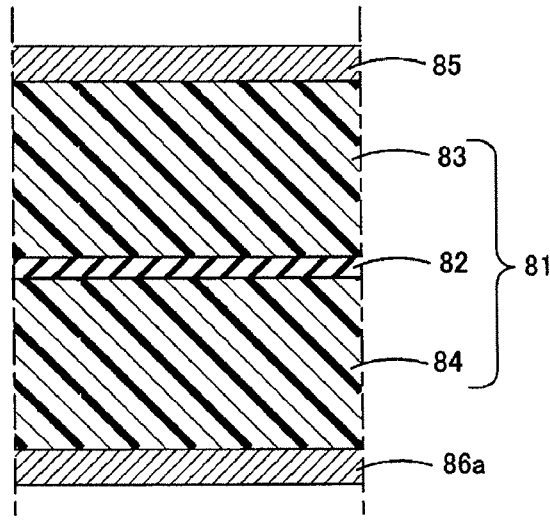
FIG. 47 is a view corresponding to FIG. 45 and illustrating a piezoelectric speaker 11v according to a twentieth embodiment of the present invention.
Figure 48:
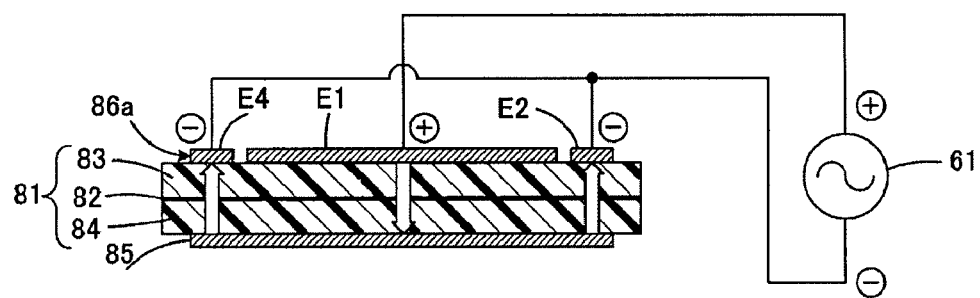
FIG. 48 is a view graphically illustrating a circuit structure for supplying an alternating-current signal to the piezoelectric speaker 11v illustrated in FIG. 47.

FIGS. 47 and 48 are views corresponding respectively to FIGS. 45 and 46 for describing a piezoelectric speaker 11v according to a twentieth embodiment of the present invention. In FIGS. 47 and 48, the components corresponding to those illustrated in FIGS. 45 and 46 are identified by the same symbols, and the repeated description will not be made.

The twentieth embodiment is characterized in that only the first electrode 85 is set to be the divided electrode, and the second electrode 86a is set to be the common electrode, compared to the nineteenth embodiment. Therefore, like the seventeenth embodiment, the circuit structure for supplying the alternating-current signal to the piezoelectric speaker 11v from the alternating-signal supplying source 61 can be simplified.

According to the nineteenth embodiment and the twentieth embodiment described above, the number of processes required to form the electrode can be reduced, so that the cost can remarkably be reduced, as in the eighteenth embodiment. Since the electrode is not formed in the middle layer of the piezoelectric speaker 11u or 11v, light transmittance can be increased, and the transparency can be enhanced. Further, the bimorph structure can be simplified, and the risk of the peel or the like in the bimorph structure can be reduced.

Figure 49:
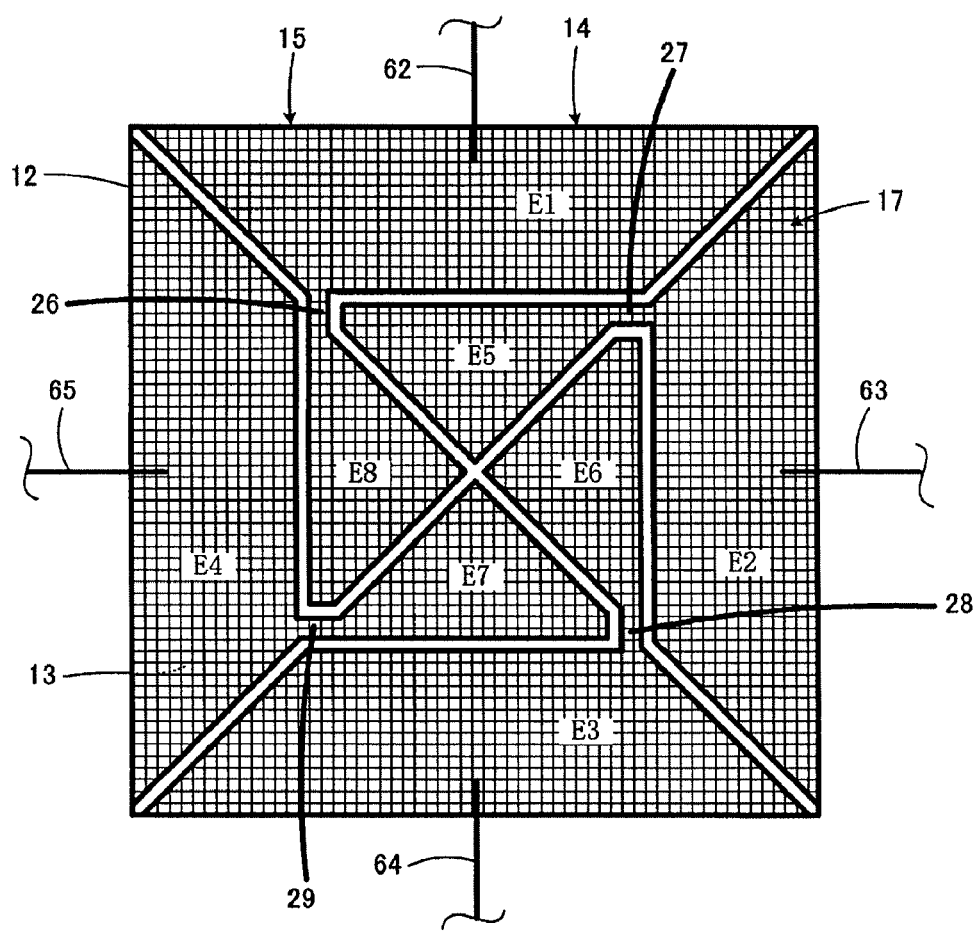
FIG. 49 is a view corresponding to FIG. 1 or FIG. 18 for describing a twenty-first embodiment of the present invention.

FIG. 49 is a view corresponding to FIG. 1 or FIG. 18 for describing a twenty-first embodiment of the present invention. In FIG. 49, the components corresponding to those illustrated in FIG. 1 or 8 are identified by the same symbols, and the repeated description will not be made.

In the piezoelectric speaker 11w illustrated in FIG. 49, each of the first and second electrodes 16 to 19 includes the first to eighth electrode portions E1 to E8, as illustrated for the second electrode 17 formed on the piezoelectric sheet 12, like the piezoelectric speaker 11c illustrated in FIG. 18. More specifically, the first electrode portion E1 and the fifth electrode portion E5 are arranged side by side in the radiation direction, the second electrode portion E2 and the sixth electrode portion E6 are arranged side by side in the radiation direction, the third electrode portion E3 and the seventh electrode portion E7 are arranged side by side in the radiation direction, and the fourth electrode portion E4 and the eighth electrode portion E8 are arranged side by side in the radiation direction.

When the piezoelectric speaker 11w described above is driven, the voltage is applied to the first to eighth electrode portions E1 to E8 in such a manner that the electric field vectors similar to the electric field vectors 25a and 25b illustrated in FIG. 18 are obtained. The present embodiment is characterized in that those having the same potential of the first to eighth electrode portions E1 to E8 are connected to a connection line, and these connection lines are formed on the respective piezoelectric sheets 12 and 13, during the drive of the piezoelectric speaker 11w.

More specifically, the first connection line 26 connecting the first electrode portion E1 and the eighth electrode portion E8, the second connection line 27 connecting the second electrode portion E2 and the fifth electrode portion E5, the third connection line 28 connecting the third electrode portion E3 and the sixth electrode portion E6, and the fourth connection line 29 connecting the fourth electrode portion E4 and the seventh electrode portion E7 are respectively formed on the piezoelectric sheets 12 and 13.

FIG. 49 illustrates power supplying lines 62, 63, 64, and 65 that are respectively connected to the electrode portions E1, E2, E3, and E4. When a signal for driving the piezoelectric speaker 11w is supplied, the signals supplied to the power supplying lines 62 and 64 are the same, and the signals supplied to the power supplying lines 63 and 65 are the same. Further, it is desirable that the signals supplied to the power supplying lines 62 and 64 and the signals supplied to the power supplying lines 63 and 65 are balance signals, each having an opposite amplitude. With this, at a certain moment, the electrode portions E1, E3, E6, and E8 have the same potential, and the remaining electrode portions E2, E4, E5, and E7 also have the same potential, wherein the electrode portions E1, E3, E6, and E8 and the electrode portions E2, E4, E5, and E7 have the different potential from each other.

Figure 50:
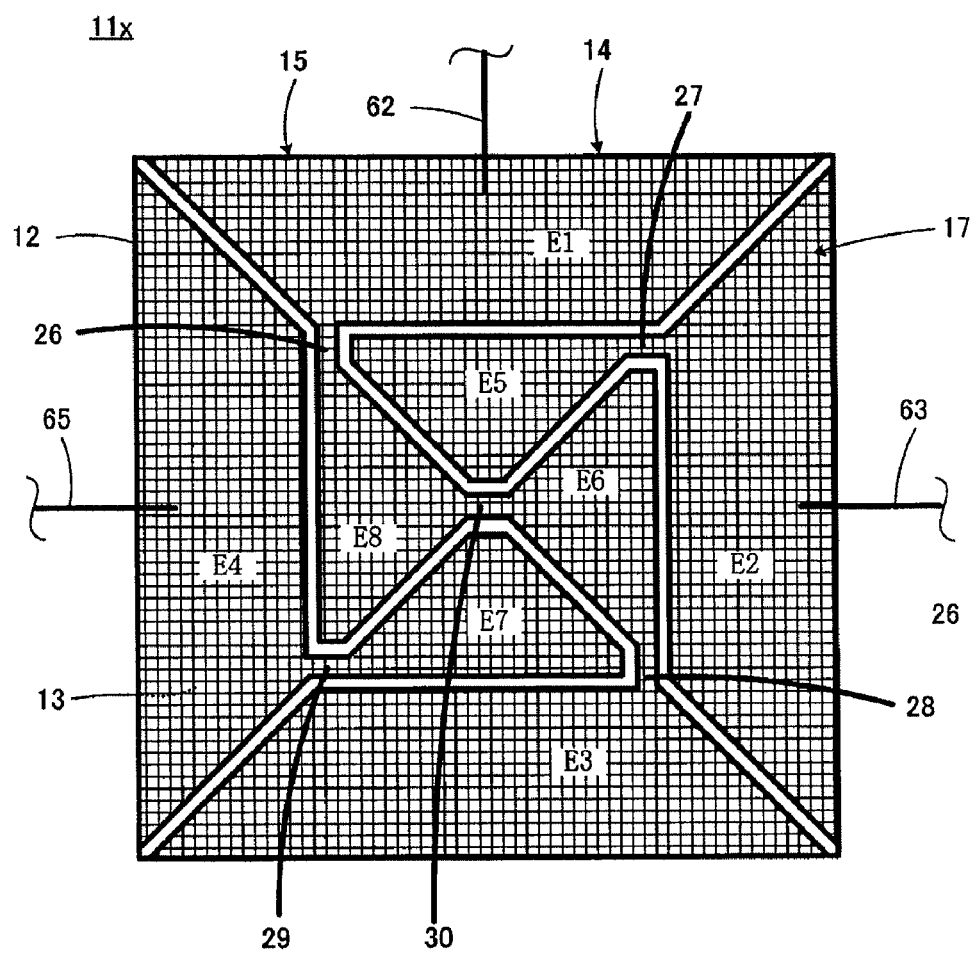
FIG. 50 is a view corresponding to FIG. 49 for describing a twenty-second embodiment of the present invention.

FIG. 50 is a view corresponding to FIG. 49 for describing a twenty-second embodiment of the present invention.

In FIG. 50, the components corresponding to those illustrated in FIG. 49 are identified by the same symbols, and the repeated description will not be made.

Compared to the piezoelectric speaker 11w illustrated in FIG. 49, a piezoelectric speaker 11x illustrated in FIG. 50 is characterized by further including a fifth connection line 30 that connects the electrode portion E6 and the electrode portion E8. According to the present embodiment, the third and sixth electrode portions E3 and E6 can be set to have the potential same as the potential of the first and eighth electrode portions E1 and E8 through the fifth connection line 30 even without the power supplying line 64 illustrated in FIG. 49. Accordingly, the power supplying line 63 can be eliminated, with the result that the structure for the electrical connection with the outside can be simplified. It is to be noted that the power supplying line 62 may be eliminated instead of the power supplying line 64 illustrated in FIG. 49.

Figure 51:
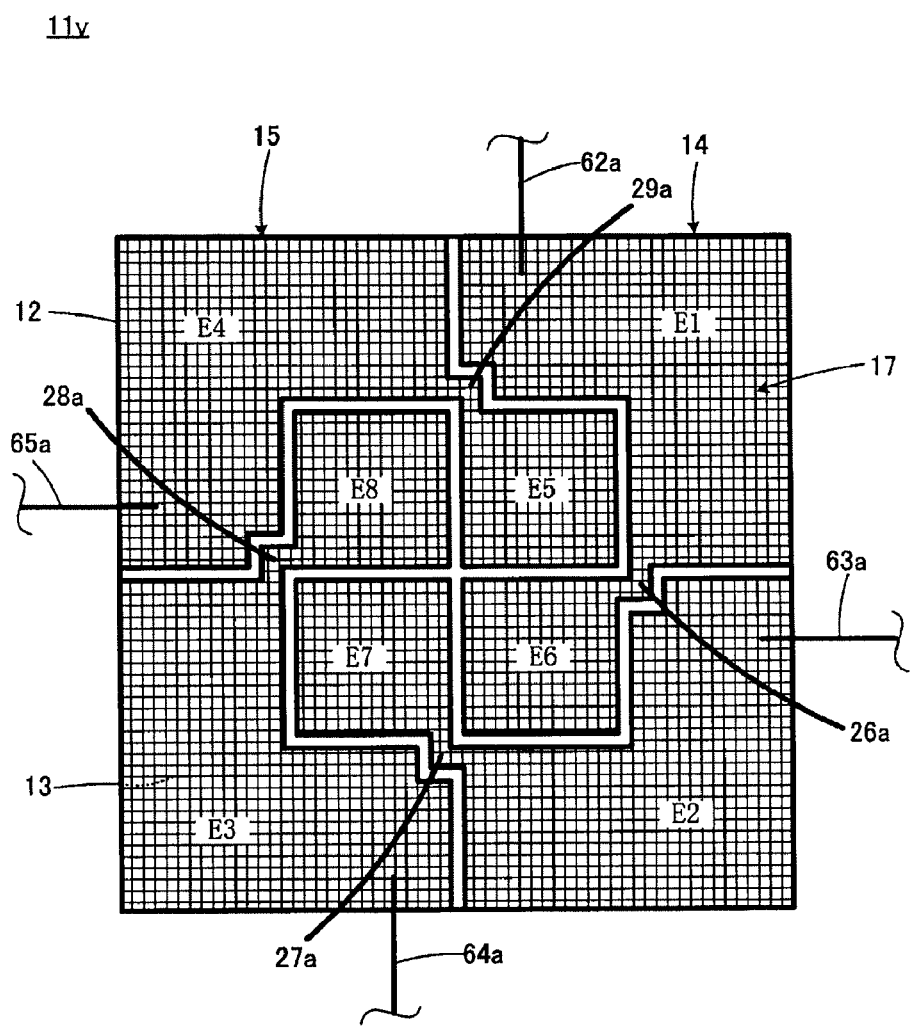
FIG. 51 is a view corresponding to FIG. 1 or FIG. 23 for describing a twenty-third embodiment of the present invention.

FIG. 51 is a view corresponding to FIG. 1 or FIG. 23 for describing a twenty-third embodiment of the present invention. In FIG. 51, the components corresponding to those illustrated in FIG. 1 or FIG. 23 are identified by the same symbols, and the repeated description will not be made.

In a piezoelectric speaker 11y illustrated in FIG. 51, each of the first and second electrodes 16 to 19 includes the first to eighth electrode portions E1 to E8 as illustrated with respect to the second electrode 17 formed on the piezoelectric sheet 12. The arrangement and shape of the first to eighth electrode portions E1 to E8 are substantially equal to those in the piezoelectric speaker 11f illustrated in FIG. 23.

Like the piezoelectric speakers 11w and 11x illustrated respectively in FIG. 49 and FIG. 50, the first electrode portion E1 and the fifth electrode portion E5, the second electrode portion E2 and the sixth electrode portion E6, the third electrode portion E3 and the seventh electrode portion E7, and the fourth electrode portion E4 and the eighth electrode portion E8, are respectively arranged side by side in the radiation direction. The first electrode portion E1 and the sixth electrode portion E6 are connected by a first connection line 26a, the second electrode portion E2 and the seventh electrode portion E7 are connected by a second connection line 27a, the third electrode portion E3 and the eighth electrode portion E8 are connected by a third connection line 28a, and the fourth electrode portion E4 and the fifth electrode portion E5 are connected by a fourth connection line 29a.

When the piezoelectric speaker 11y is driven, the power supplying lines 62a, 63a, 64a, and 65a are connected to the electrode portions E1, E2, E3, and E4 respectively. The signals applied through these power supplying lines 62a to 65a are the same as in the piezoelectric speaker 11w illustrated in FIG. 49.

According to the piezoelectric speakers 11w, 11x, and 11y illustrated respectively in FIGS. 49 to 51, the connection lines 26 to 29 or 26a to 29a are formed respectively on the piezoelectric sheets 12 and 13, and in the piezoelectric speaker 11x, the connection line 30 is further formed, whereby the wiring for supplying power to the fifth to eighth electrode portions E5 to E8 can be simplified.

The piezoelectric speaker according to the present invention includes a divided electrode having a plurality of electrode portions, wherein the electrode non-formation region between the electrode portions is easy to be bent, compared to the electrode portions. Specifically, when the piezoelectric speaker is vibrated, stress tends to be concentrated on the electrode non-formation region. Therefore, when vibration is applied for a long period, cracks might be produced on the electrode non-formation region between the electrode portions on the piezoelectric sheet. When the electrode non-formation region between electrode portions of a certain electrode and an electrode non-formation region between electrode portions of the other electrode are overlapped with each other, as seen through the piezoelectric sheet in the thickness direction thereof, in particular, the above-mentioned crack tends to generate.

It is effective that the electrode non-formation regions for the respective different electrodes are not substantially overlapped with each other, as seen through the piezoelectric sheet in the thickness direction thereof, in order to solve the problem described above. The embodiment in which the structure described above is employed will specifically be described with reference to FIGS. 52 and 53.

Figure 52:
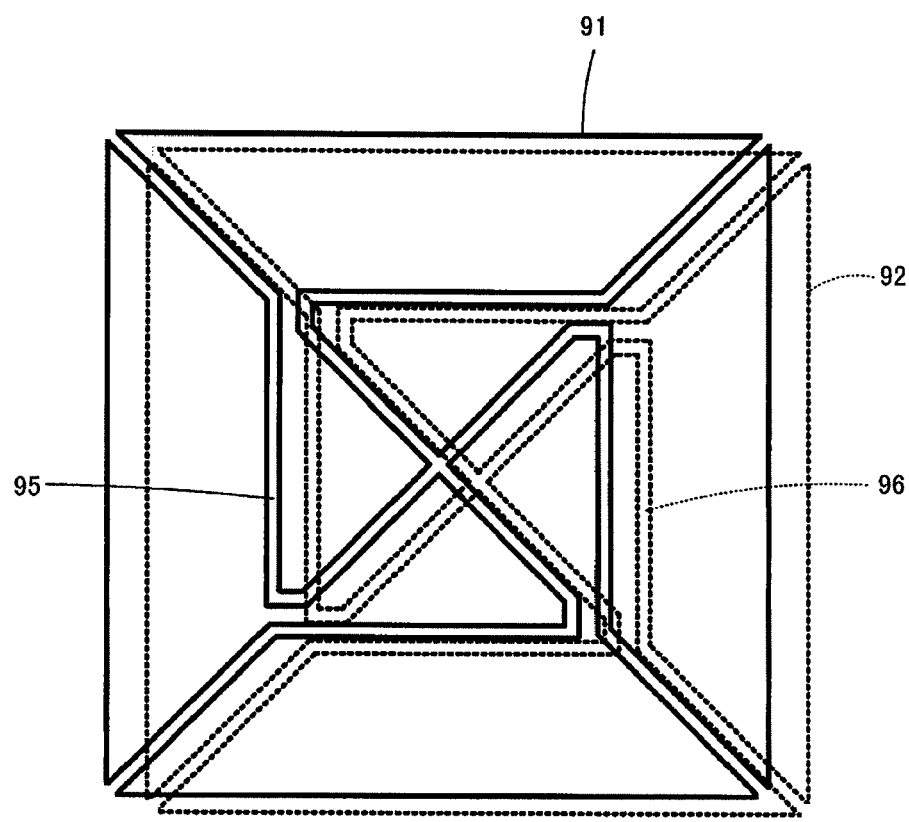
FIG. 52 is a plan view illustrating first and second electrodes 91 and 92 that are overlapped with each other for describing a twenty-fourth embodiment of the present invention.
Figure 53:
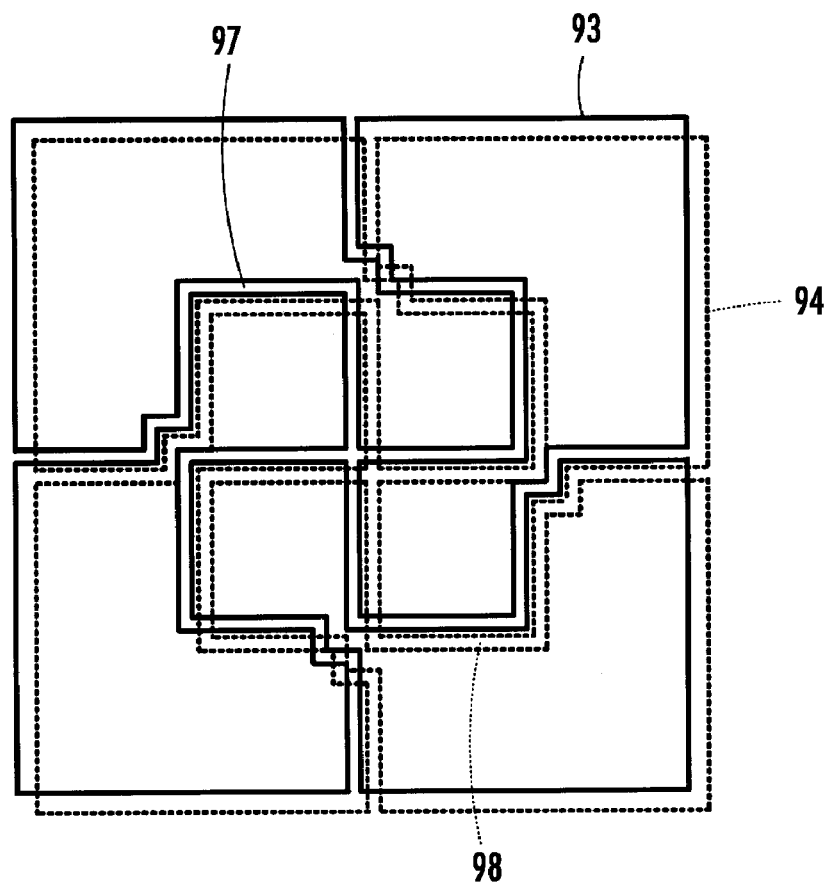
FIG. 53 is a plan view illustrating first and second electrodes 93 and 94 that are overlapped with each other for describing a twenty-fifth embodiment of the present invention.

FIGS. 52 and 53 are views for describing twenty-fourth embodiment and twenty-fifth embodiment of the present invention, wherein the electrodes formed on the piezoelectric sheet is illustrated in a plan view.

FIG. 52 illustrates electrodes 91 and 92 having the pattern same as that of the electrode 17 provided to the piezoelectric speaker 11w illustrated in FIG. 49. FIG. 53 illustrates electrodes 93 and 94 having the pattern same as that of the electrode 17 provided to the piezoelectric speaker 11y illustrated in FIG. 51.

In FIGS. 52 and 53, there are a case in which the first electrodes 91 and 93 indicated by a solid line and the second electrodes 92 and 94 indicated by a dotted line are formed on a front surface and a back surface respectively on one piezoelectric sheet and a case in which they are formed respectively on different piezoelectric sheets, and in either case, they have the positional relationship in which they are overlapped with each other as seen through the piezoelectric sheet in the thickness direction thereof.

Referring to FIG. 52 firstly, electrode non-formation regions 95 are positioned between the respective electrode portions obtained by dividing the first electrode 91. On the other hand, electrode non-formation regions 96 are positioned between the respective electrode portions obtained by dividing the second electrode 92. The first electrode 91 and the second electrode 92 are slightly shifted from each other, as seen through the piezoelectric sheet in the thickness direction thereof, with the result that the electrode non-formation regions 95 for the first electrode 91 and the electrode non-formation regions 96 for the second electrode 92 are not overlapped with each other except for a small part. Therefore, concentration of stress on the electrode non-formation regions 95 and 96 on the piezoelectric sheet is eased, which can make it difficult to produce cracks on the piezoelectric sheet.

The electrodes 91 and 92 have connection line 26 to 29, each having a relatively small thickness, as well illustrated in FIG. 49. The concentration of stress tends to occur on these connection lines 26 to 29, but the breakdown can be difficult to occur on these connection lines 26 to 29 by allowing the electrode non-formation regions 95 and 96 not to substantially be overlapped with each other as described above.

Referring next to FIG. 53, electrode non-formation regions 97 are positioned between the respective electrode portions obtained by dividing the first electrode 93. On the other hand, electrode non-formation regions 98 are positioned between the respective electrode portions obtained by dividing the second electrode 94. The first electrode 93 and the second electrode 94 are slightly shifted from each other, as seen through the piezoelectric sheet in the thickness direction thereof, with the result that the electrode non-formation regions 97 for the first electrode 93 and the electrode non-formation regions 98 for the second electrode 94 are not overlapped with each other except for a small part. Therefore, concentration of stress on the electrode non-formation regions 97 and 98 on the piezoelectric sheet is eased, which can make it difficult to produce cracks on the piezoelectric sheet.

Further, this embodiment can also make the breakdown difficult to occur on connection lines 26a to 29a, each having a relatively small thickness, illustrated well in FIG. 51.

As can be understood through the comparison between FIGS. 52 and 53, in the twenty-fifth embodiment illustrated in FIG. 53, the shift between the first electrode 93 and the second electrode 94 is more uniform, and the shift amount for allowing the electrode non-formation regions 97 and 98 not to be overlapped with each other can be more reduced, compared to the twenty-fourth embodiment illustrated in FIG. 52.

The above-mentioned twenty-fourth embodiment and the twenty-fifth embodiment provide an effect that they can make it difficult to produce cracks on the piezoelectric sheet and breakdown on the connection lines, and further, they can allow the electrode non-formation regions 95 to 98 having relatively high transparency not to be overlapped with each other as much as possible in the thickness direction of the piezoelectric sheet, whereby a feeling of visual strangeness caused by the overlap of the electrode non-formation regions 95 to 98 can be reduced.

Even if the first electrode 91 or 93 and the second electrode 92 or 94 are slightly shifted as in the twenty-fourth embodiment and the twenty-fifth embodiment, the displacement manner of the piezoelectric speaker substantially equal to the displacement manner in the case where they are not shifted can be achieved.

The configuration in which the electrode non-formation regions are substantially not overlapped with each other as described above can be applied not only to the illustrated twenty-first embodiment and the twenty-third embodiment but also to the other embodiments including the first embodiment, for example.

When the configuration in which the electrode non-formation regions are substantially not overlapped with each other is employed for the first and second electrodes, the first and second electrodes may not have the same pattern.

A usage of the piezoelectric speaker according to the present invention will be described next.

The piezoelectric speaker according to the present invention can be configured to be transparent as described above, and since it does not need a component such as an exciter, it can be configured to be transparent on all surfaces. Therefore, as the speaker is directly arranged on the display surface 32 of the cellular phone 31 illustrated in FIG. 12, and on a display surface of a portable game machine, the image below the speaker can clearly be recognized visually.

Similarly, the piezoelectric speaker according to the present invention can also be directly arranged on a display surface, such as a liquid crystal panel display, a plasma display, an organic EL display, or an inorganic EL display, in an electronic dictionary, an electronic notebook, a personal computer, a television receiver, etc. In this manner, since the piezoelectric speaker according to the present invention is formed on the display surface, a television receiver or a PC display, which does not need a dynamic speaker that has conventionally been needed, can be formed.

A speaker has to be large-sized in order to achieve a high-quality sound, but an existing piezoelectric speaker has a limitation from the viewpoint of a space in a device. As described above, according to the present invention, the speaker can be made transparent, and can directly be arranged on a display surface. Therefore, the area of the speaker can be increased to enhance sound quality. Further, a conventional built-in speaker can be eliminated, with the result that a device can be downsized, or a new functional component can be incorporated in the portion from which the built-in speaker is removed, whereby the function of the device can be enhanced.

Since the piezoelectric sheet is made of a polymer, attention should be focused on the feature that it is not broken with a normal impact. Accordingly, it is advantageously applied to a portable device such as a portable game machine or a cellular phone.

Further, a television receiver using a flat panel display has recently been thin-sized and large-sized, and a portable sheet-type television receiver using an organic EL and having flexibility or a wall-hanging television receiver has been put to practical use. The piezoelectric speaker according to the present invention has flexibility, so that it is very useful to the portable sheet-type television receiver. The amplitude of the speaker is about several micrometers to several hundred micrometers, so that it is generally difficult to be visually confirmed, with the result that, even if it is formed on the surface of the display, a feeling of strangeness is not produced.

With respect to a wall-hanging television receiver, it is important not to reduce a high-quality specification of the television receiver, and hence, the deterioration in the image quality caused by the arrangement of the piezoelectric speaker on the surface of the display is a matter of concern. In order to solve this problem, the configuration illustrated in FIG. 54 is advantageously employed.

Figure 54:
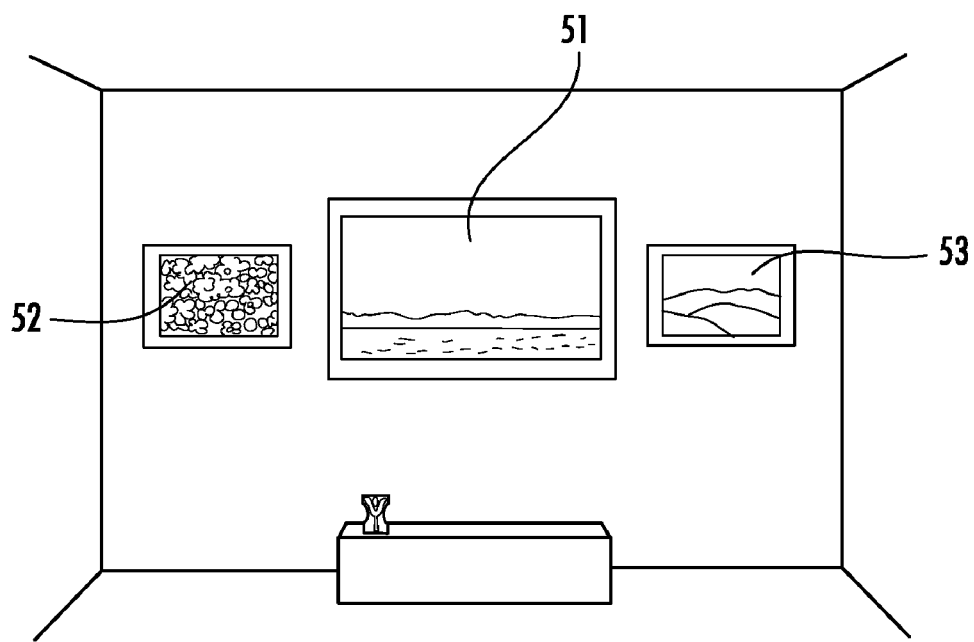
FIG. 54 is a view illustrating a state in which frames 52 and 53 that constitute a speaker apparatus using the piezoelectric speaker according to the present invention are hung at both sides of a wall-hanging television receiver 51.
Figure 55:
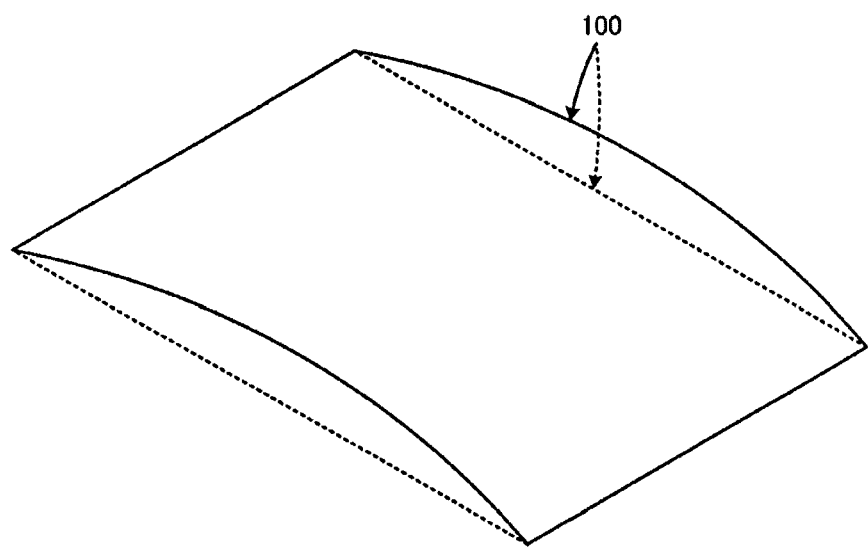
FIG. 55 is a view graphically illustrating a result of the displacement when electrodes are formed on both surfaces of a PVDF sheet to which a poling is performed in the thickness direction, and two sheets are bonded to make a bimorph 100, wherein the displacement is calculated by a finite element method.

With reference to FIG. 54, frames 52 and 53 of painting and poster are hung at both sides of a wall-hanging television receiver 51. Although not illustrated, a piezoelectric speaker is arranged on the front surface of the frames 52 and 53. For example, a piezoelectric speaker is mounted instead of the front glass plate of the frames 52 and 53. Accordingly, the piezoelectric speaker can be formed to have high interior property.

Further, it is unnecessary to incorporate the speaker in the display portion of the television receiver 51, whereby this portion can more be reduced.

Additionally, the piezoelectric speaker according to the present invention can advantageously be applied to the usage described below.

For example, when it is mounted to a window near the vicinity of a priority seat in a train or a bus, elderly persons can easily hear a train announcement, and further, it cannot hinder the field of view seen from a train window.

Recently, a message card such as high-grade Christmas card has been popular. In the message card described above, it can be used as a speaker serving as a decoration.

A speaker is mounted to an advertisement on a wall face, in particular, a face portion of an advertisement having a person's face illustrated therein, and advertisement is made as a sound as if the person talks, which can attract public attention to increase the advertisement effect. In this case, it is more effective if it is combined with an infrared sensor or a Doppler sensor in order to allow it to call (call out) when a person approaches.

Further, it can directly be mounted on a surface of a pinball machine or slot machine. When a sound is made from all surfaces, powerful performance can be made.

Further, it can be applied to a tactile feedback described below.

A touch panel is mostly employed for a cellular phone, electronic notebook, mobile music player, portable game machine, and ticket machine installed in a station or the like. The touch panel has a very great degree of freedom in displaying an arrangement of buttons, types, and design by an image, and its use tends to increase in the future.

The touch panel is operated only by being touched, as its name suggests, but compared to the normal button operation, a click feeling cannot be obtained, so that the recognition of sure operation cannot be obtained from a feeling. The means for reporting the result of the operation with a sound has been frequently used, but it disturbs an operating person in most cases, because it cannot be used in a mass transit system such as a train or it cannot be heard in a very noisy place. Further, there is a problem that a visually-impaired person is difficult to feel an operation feeling with a touch panel on a ticket machine, in particular.

Meanwhile, recent cellular phones with a touch panel include a vibrator operated in synchronization with the operation on the touch panel and cellular phones in which the touch panel itself is vibrated with an actuator. However, in the former, the feeling of the operation is obtained, but this feeling is far from a sense of click, and the latter has a disadvantage that the device is large-sized since the actuator is incorporated therein.

On the other hand, the piezoelectric speaker according to the present invention can be used as a vibrating plate that vibrates with a specific frequency with the use of a resonance point, so that when this piezoelectric speaker is attached as it is on the touch panel, the vibration, which can be a pseudo click feeling, can be transmitted to fingers. Accordingly, it is unnecessary to use the components such as the actuator, whereby a tactile feedback can easily be formed.

The invention claimed is:

1. A piezoelectric speaker comprising:
   a laminated body having a plurality of polymer sheets, wherein at least one of the plurality of polymer sheets is a piezoelectric sheet having a predetermined stretching axis and composed of a chiral polymer;
   first and second electrodes positioned within a vibration region on opposing first and second main surfaces of the piezoelectric sheet, wherein
   at least one of the first and second electrodes is a divided electrode that includes a plurality of divided electrode portions, the plurality of divided electrode portions being separated by a plurality of dividing lines extending in a radiation direction, and the plurality of electrode portions being distributed along an outer peripheral portion of the vibration region except for a central portion,
   the plurality of dividing lines have any one of angles within a range of (1) 0 degrees or more and less than 40 degrees with respect to the stretching axis and (2) more than 50 degrees to 90 degrees or less with respect to the stretching axis.

2. The piezoelectric speaker according to claim 1, wherein the plurality of electrode portions are arranged in such a manner that, when a voltage is applied thereto, electric field vectors generated in a thickness direction of the piezoelectric sheet are in opposite directions in adjacent portions of the piezoelectric sheet to corresponding to each of the plurality of electrode portions.

3. The piezoelectric speaker according to claim 1, wherein the plurality of electrode portions include first, second, third and fourth electrode portions.

4. The piezoelectric speaker according to claim 3, wherein the divided electrode is distributed on the central portion of the vibration region and separated from the first to fourth electrode portions, and further includes fifth, sixth, seventh and eighth electrode portions divided by the plurality of dividing lines.

5. The piezoelectric speaker according to claim 4, wherein the first electrode portion and the fifth electrode portion are arranged side by side in the radiation direction, the second electrode portion and the sixth electrode portion are arranged side by side in the radiation direction, the third electrode portion and the seventh electrode portion are arranged side by side in the radiation direction, and the fourth electrode portion and the eighth electrode portion are arranged side by side in the radiation direction, and
a first connection line connecting the first electrode portion and one of the sixth and eighth electrode portions, a second connection line connecting the second electrode portion and one of the fifth and seventh electrode portions, a third connection line connecting the third electrode portion and the other of the sixth and eighth electrode portions not connected by the first connection line, and a fourth connection line connecting the fourth electrode portion and the other of the fifth and seventh electrode portions not connected by the second connection line.

6. The piezoelectric speaker according to claim 1, wherein the plurality of electrode portions include two electrode portions located respectively on opposed portions in a circumferential direction on the outer peripheral portion except for the central portion of the vibration region on the piezoelectric sheet, and
the two electrode portions are arranged such that, when a voltage is applied, electric field vectors generated in a thickness direction of the piezoelectric sheet direct in a same direction.

7. The piezoelectric speaker according to claim 1, wherein the respective first and second electrodes are the divided electrodes.

8. The piezoelectric speaker according to claim 7, wherein an electrode non-formation region located between the respective electrode portions of the first electrode and an electrode non-formation region located between the respective electrode portions of the second electrode are not substantially overlapped with each other in a thickness direction of the piezoelectric sheet.

9. The piezoelectric speaker according to claim 7, wherein the first and second electrodes have substantially the same pattern.

10. The piezoelectric speaker according to claim 1, wherein
only one of the first and second electrodes is the divided electrode, and the other of the first and second electrodes is a common electrode positioned opposite to the plurality of electrode portions of the divided electrode.

11. The piezoelectric speaker according to claim 10, wherein
the piezoelectric sheet includes first and second piezoelectric sheets bonded to each other with the respective first main surfaces facing each other, wherein the first electrode is a conductive adhesive agent and bonds the respective first main surfaces of the first and second piezoelectric sheets, the second electrode is formed on the second main surface opposite to the respective first main surfaces of the first and second piezoelectric sheets, the first electrode is the common electrode, the second electrode is the divided electrode.

12. The piezoelectric speaker according to claim 10, wherein the common electrode is connected to ground.

13. The piezoelectric speaker according to claim 1, wherein
the piezoelectric sheet includes bonded first and second piezoelectric sheets, wherein
the first and second electrodes are positioned on opposing first and second main surfaces of the first piezoelectric sheet and positioned on opposing first and second main surfaces of the second piezoelectric sheet.

14. The piezoelectric speaker according to claim 13, wherein
an electrode non-formation region located between the respective electrode portions of the divided electrode on the first piezoelectric sheet, and an electrode non-formation region located between the respective electrode portions of the divided electrode on the second piezoelectric sheet are not substantially overlapped with each other in the thickness direction of the piezoelectric sheet.

15. The piezoelectric speaker according to claim 1, wherein
the piezoelectric sheet has a laminated structure including first and second piezoelectric sheet layers bonded to each other with a bonding layer interposed therebetween, wherein
the stretching axis of the first piezoelectric sheet layer and the stretching axis of the second piezoelectric sheet layer are opposite in direction, and the first and second electrodes are respectively positioned on the opposing first and second main surfaces of the piezoelectric sheet having the laminated structure.

16. The piezoelectric speaker according to claim 1, wherein the vibration region is distributed in a plurality of portions on the piezoelectric sheet.

17. The piezoelectric speaker according to claim 16, wherein the divided electrode is a first divided electrode within a first of the plurality of vibration regions, and the piezoelectric speaker further includes a second divided electrode within a second of the plurality of vibration regions, wherein patterns and sizes of the first and second divided electrodes are the same.

18. The piezoelectric speaker according to claim 16, wherein the divided electrode is a first divided electrode within a first of the plurality of vibration regions, and the piezoelectric speaker further includes a second divided electrode within a second of the plurality of vibration regions, wherein at least one of patterns and sizes of the first and second divided electrodes are different from each other.

19. The piezoelectric speaker according to claim 1, wherein the chiral polymer is poly-L-lactic-acid.

20. The piezoelectric speaker according to claim 1, wherein the first and second electrodes include a layer containing at least one of indium tin oxide, indium zinc oxide, and zinc oxide.

21. The piezoelectric speaker according to claim 1, wherein the first and second electrodes include a layer made of at least one of polythiophene conductive polymer and polyaniline conductive polymer.

22. The piezoelectric speaker according to claim 1, wherein
the first and second electrodes have a structure in which a layer containing zinc oxide and a layer of polythiophene conductive polymer are overlapped with each other in a lamination direction of the laminated body.

23. A speaker apparatus comprising:
a frame; and
the piezoelectric speaker according to claim 1 arranged on a front surface of the frame.

24. The speaker apparatus according to claim 23, wherein the frame is configured to be hung on a wall.

25. A tactile feedback apparatus having the piezoelectric speaker according to claim 1 on a surface of a touch panel.

* * * * *